US009273393B2

(12) United States Patent
Glukhoy

(10) Patent No.: US 9,273,393 B2
(45) Date of Patent: Mar. 1, 2016

(54) TORCH SYSTEM FOR DEPOSITING PROTECTIVE COATINGS ON INTERIOR WALLS AND RECESSES PRESENT ON THE FLAT SURFACE OF AN OBJECT

(71) Applicant: Yuri Glukhoy, San Francisco, CA (US)

(72) Inventor: Yuri Glukhoy, San Francisco, CA (US)

( * ) Notice: Subject to any disclaimer, the term of this patent is extended or adjusted under 35 U.S.C. 154(b) by 126 days.

(21) Appl. No.: 14/164,168

(22) Filed: Jan. 25, 2014

(65) Prior Publication Data
US 2015/0211123 A1      Jul. 30, 2015

(51) Int. Cl.
| | |
|---|---|
| C23C 16/00 | (2006.01) |
| C23C 16/453 | (2006.01) |
| C23C 16/04 | (2006.01) |
| C23C 16/32 | (2006.01) |
| C23C 16/40 | (2006.01) |
| C23C 16/507 | (2006.01) |
| C23C 16/513 | (2006.01) |
| C23C 16/52 | (2006.01) |
| H01J 27/02 | (2006.01) |

(52) U.S. Cl.
CPC .............. *C23C 16/453* (2013.01); *C23C 16/045* (2013.01); *C23C 16/325* (2013.01); *C23C 16/405* (2013.01); *C23C 16/507* (2013.01); *C23C 16/513* (2013.01); *C23C 16/52* (2013.01); *H01J 27/02* (2013.01)

(58) Field of Classification Search
CPC .................................. H01J 27/02; C23C 16/00
USPC ........................................................ 118/649
See application file for complete search history.

(56) References Cited

U.S. PATENT DOCUMENTS

| | | | | |
|---|---|---|---|---|
| 5,759,280 | A | * | 6/1998 | Holland et al. .............. 118/723 I |
| 6,080,287 | A | * | 6/2000 | Drewery et al. ......... 204/192.15 |
| 6,211,622 | B1 | * | 4/2001 | Ryoji et al. ............... 315/111.21 |
| 6,215,091 | B1 | | 4/2001 | Chung et al. |
| 6,919,527 | B2 | | 7/2005 | Boulos et al. |
| 2003/0168172 | A1 | * | 9/2003 | Glukhoy ................... 156/345.28 |
| 2004/0195218 | A1 | | 10/2004 | Tao et al. |
| 2005/0258149 | A1 | * | 11/2005 | Glukhoy et al. .......... 219/121.48 |

(Continued)

FOREIGN PATENT DOCUMENTS

JP    2000-323456    11/2000

OTHER PUBLICATIONS

Yang Yang and Mark J. Kushner (see Journal of Applied Physics 108, 113306, 2010).
Sansonnens and Schmitt (see L. Sansonnens and J. Schmitt, Appl. Phys. Lett. 82, 182, 2003).

(Continued)

*Primary Examiner* — Nina Bhat

(57) ABSTRACT

A torch system for deposition of protective coatings on the walls of holes and recesses on the surface of showerheads includes a capacitive coupling plasma processing apparatuses. The system comprises an atmospheric-pressure inductively coupled plasma reactor for the formation of a plasma torch, a showerhead holder for moving the showerhead relative to the tip of the torch during deposition of the protective coating, and a plasma torch focusing device for squeezing and focusing the tip of the torch to cross-sectional dimensions comparable with the diameters of the gas holes of the showerhead which may be as small as 0.5 mm. The focusing device is moveable relative to the plasma reactor and the treated object in the direction perpendicular to the surface of the object. The movements of the showerhead and of the focusing device relative to the treated surface are automatically adjusted through feedbacks for maintaining the torch tip at optimal parameters.

12 Claims, 12 Drawing Sheets

(56) References Cited

U.S. PATENT DOCUMENTS

| | | |
|---|---|---|
| 2006/0024199 A1 | 2/2006 | Tao et al. |
| 2008/0083712 A1 | 4/2008 | Tao et al. |
| 2010/0300620 A1 | 12/2010 | Kanda |
| 2011/0056918 A1 | 3/2011 | Brezni et al. |
| 2012/0325777 A1* | 12/2012 | Okumura et al. ............... 216/68 |

OTHER PUBLICATIONS

TORCH Inductor of Tekna plasma system http://www.tekna.com/technology/plasma-state/.

Brooks Instrument GF81 High-Flow MFS.

* cited by examiner

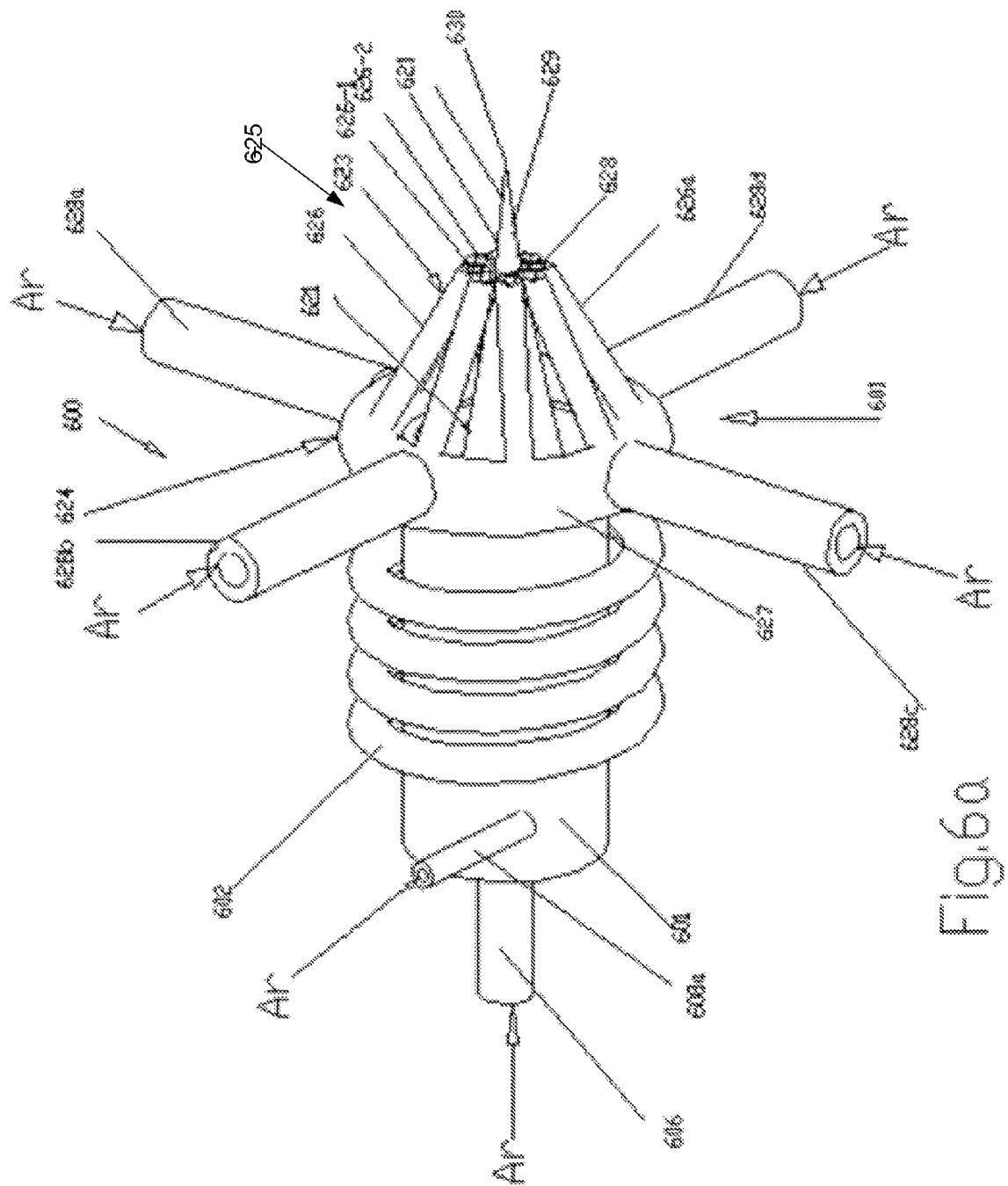

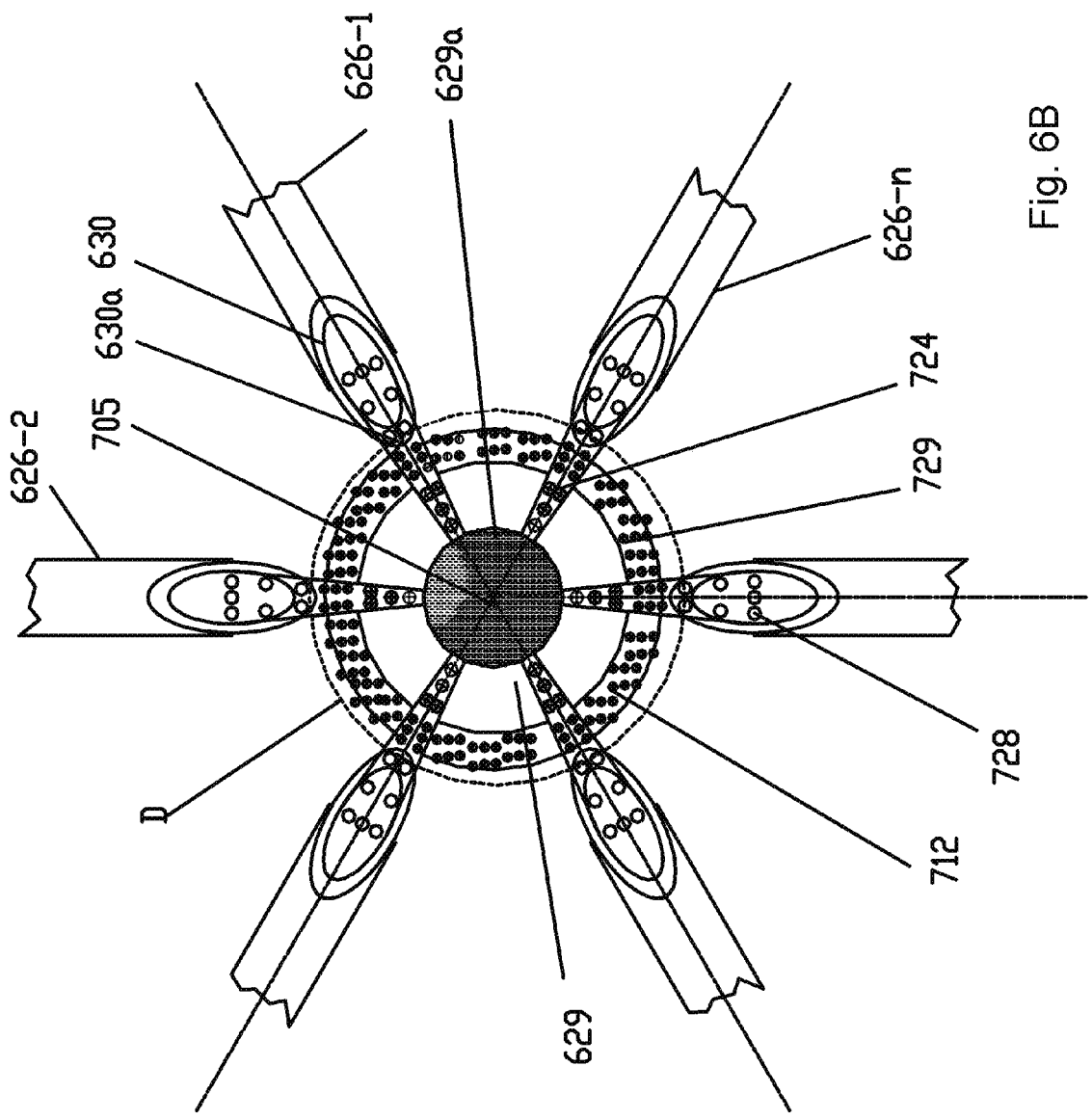

TORCH SYSTEM FOR DEPOSITING PROTECTIVE COATINGS ON INTERIOR WALLS AND RECESSES PRESENT ON THE FLAT SURFACE OF AN OBJECT

FIELD OF THE INVENTION

The invention relates to the field of semiconductor production, in particular to manufacturing of a showerhead-cooler system of a semiconductor-processing chamber with uniform distribution of plasma density. More specifically, the invention relates to an atmospheric-pressure inductively coupled plasma (AP-ICP) torch system for application of protective coatings on the walls of small-diameter holes and recesses machined on flat surfaces, in particular to application of yttrium oxide or silicon carbide coatings resistant to chemical corrosion and discharge breakdown onto the surfaces of conical recesses and inner walls of through gas holes in showerheads used in a showerhead/cooler system of capacitive coupling plasma (CCP) apparatus. In particular, the invention relates to a torch system for application of yttrium oxide or silicon carbide coating by an atmospheric-pressure inductively coupled plasma method onto the surfaces of holes and conical recesses formed in the showerhead of a CCP treatment apparatus intended for plasma processing of semiconductor wafers with a diameter of 450 mm or greater.

BACKGROUND OF THE INVENTION

The fabrication of integrated circuits (IC) in the semiconductor industry typically employs plasma discharge, especially CCP discharge, to create and assist surface chemistry within a processing chamber necessary to remove material from and deposit material onto a substrate.

Wafer sizes continually increase, and after transition from the diameter of 300 mm, the wafer sizes in microelectronics fabrication today have a diameter of 450 mm. Thus, the surface area of a wafer has increased 2.25 times, and therefore it becomes more difficult to provide plasma density needed for etching processes.

For a 450-mm wafer, the scaling method that was used successfully during the previous periodical increase in wafer size does not work anymore because the proportional increase in power from an RF generator will lead to extra high voltage and electrical breakdown and arcing in the plasma processing chamber.

One solution to this problem is to increase the frequency of a capacitive discharge. This improves power coupling to the plasma because of the decrease in sheath screening. High-frequency excitation allows a much higher rate of ion flux (i.e., plasma density) when compared with classical 13.56-MHz excitation at the same RF power. However, at frequencies much higher than 13.56 MHz, the electromagnetic effects cause some problems that lead to the deterioration of uniformity in plasma density. Such nonuniformity may be caused mainly by the following three factors: (1) a standing wave effect that enhances RF power deposition at the discharge center; (2) an edge effect known as a "telegraph effect" that creates reflection of RF power from the edges and causes some plasma density perturbation from the edges; and (3) a skin effect that enhances RF power deposition near the edges of the showerhead and tends to increase local plasma density in the vicinity of the edges.

These factors cause drastic changes in distribution of plasma density and ion flux and eventually result in nonuniform etching. Therefore, enhancement of uniformity is a key consideration for transition to high-frequency excitation.

CCP reactive ion etching tools usually use a dual frequency model that originates from the desire to separately control the magnitude of ions and radical flux, on one hand, and ion energy distribution to the wafer, on the other hand. A reactive ion etching system with dual frequency typically consists of a parallel-plate plasma-etching chamber wherein the CCP discharge is generated between an upper electrode, or cathode, and a lower electrode with a wafer. A conductive silicon wafer is held by an electrostatic chuck and is surrounded by a silicon focusing ring and a dielectric outer ring. The wafer, the electrostatic chuck, and the focusing ring are combined into a wafer system. Both electrodes are joined through matching networks to separate RF generators with a frequency ratio from (10:1) to (10:5), wherein a higher-frequency generator is connected to the upper electrode (cooler plate), and another generator that operates at a lower frequency is connected to the wafer system through a blocking capacitor.

The showerhead is made from a conductive high-purity material such as a single crystal silicon, polycrystalline silicon, or silicon carbide. A chemically reactive gas such as $CF_4$, $CHF_3$, $CClF_3$, $SF_6$, or a mixture thereof with $O_2$, $N_2$, He, or Ar is introduced in the plasma processing space and maintained at a pressure that is typically in the millitorr range.

Due to the difficulty in drilling gas holes having a high length-to-diameter ratio through a relatively thick showerhead plate of silicon, the gas holes are formed by first forming the countersinks on the back side of the showerhead and then drilling relatively narrow passages of approximately 0.5 mm in diameter through the remaining portion of the showerhead plate. This diameter is found to provide an indispensable gas flow rate. On the other hand, due to such a small diameter in spite of a matrix of holes, the surface of the process side of the showerhead remains relatively smooth, and the sheath plasma uniformity is not deteriorated either by the matrix structure of such a surface or by surface roughness. As a result, under high pressure developed in the gas pressure reservoir between the showerhead and the cooler plate, the gas flow that is fed through the gas-feed passages of the cooler plate redistributes some pressure to the lower-pressure side so that this redistributed pressure penetrates into the plasma processing chamber, resulting in uniform flow-rate distribution across the entire plasma processing chamber.

One characteristic that is generally required for the gas delivery system is strict control of passage dimensions and spacing between the gas holes of the showerhead so that uniform gas distribution is maintained on a particular surface area of the showerhead. The showerhead is a consumable part that is supposed to be replaced periodically because etching and ion bombardment during plasma processing erodes the side of the showerhead that faces the plasma. Usually, instead of replacing the showerhead, the eroded part of the process side is removed by polishing, after which the process side of the showerhead can serve for two more additional terms. An electrical and mechanical contact between the cooler plate and the showerhead is provided through the periphery portion of the showerhead backside. In other words, RF voltage is applied to the periphery of the showerhead backside, and because of the recess in the cooler plate, the central part of the showerhead does not contact the cooler plate. Thus, RF power propagates from the edges in the radial inward direction to the center of the showerhead through the thin layer on the process side of the showerhead, which is made from silicon. Generally, surface resistance of silicon is approximately 200 Ohm/$cm^2$. Therefore, at the conventional frequency of 13.56 MHz, surface impedance allows launching of the electromagnetic waves into the plasma from the total surface of the showerhead rather than from edges where the showerhead is connected to the cooler plate.

For small-diameter showerheads, e.g., those intended for processing 300-mm wafers and operating at low frequencies of RF power, e.g. 13.56 MHz, the transfer of power from the cooler plate to the showerhead through the edges, i.e., through the areas of contact between the cooler plate and the showerhead, does not drastically affect the uniformity of the plasma generated under the process side of the showerhead in the processing space of the plasma process chamber. This is because the wavelength of RF power is much larger than the diameter of the showerhead, and in this case RF power uniformly propagates from the edges to the center and is transferred to a plasma discharge from the total surface of the showerhead into the conductive bulk plasma. This discharge ionizes and dissociates the reactive gas that forms plasma, thus generating ions and chemically active radical particles. The ions strike the surface of the wafer that is to be etched by chemical interaction and momentum transfer. Because ion flow is predominantly normal to the surface of the wafer, the process produces well-defined vertically etched sidewalls. The highly reactive radicals are not charged and can penetrate even into the narrow and deep trenches on the wafer and provide etching there. Ion bombardment energy is influenced by excitation in the plasma sheath adjacent to the wafer because low-frequency voltage is applied to the bottom of the chuck (lower electrode).

Thus, the level of power introduced into the system at low frequency provides control of coordinates and angular distribution of ion energy across the surface of the wafer. However, when high-frequency power is applied to the showerhead (upper electrode) from the cooler plate through the zone of contact with the showerhead, plasma density is controlled by high currents that are displaced more significantly toward the aforementioned zone of contact and increase the Ohmic power transferred to the plasma and cause heating of the plasma sheath. In other words, under the conditions described above, RF power of high frequency is responsible for generating ions and radicals. Because the system operates at dual frequencies, plasma density and the ion bombardment energy can be adjusted separately.

RF power is supplied from an RF power supply unit through a matching network and the cooler plate to the backside of the showerhead specifically through the periphery of the latter (as mentioned above, the central part of the cooler plate is occupied by a recess). Power is transmitted through the process-side showerhead surface to the plasma. Higher frequency causes greater intensity of the electrical field at the central part of the showerhead working surface than at the peripheral portion of the showerhead. Therefore, the density of generated plasma is higher at the central part of the process space than at the peripheral portion of the process space. As a result, the uniformity of the plasma density further deteriorates, which results in poor planar uniformity and charge-up damage to the plasma etching.

With an increase in showerhead size and much higher frequency required to support the optimal level of plasma density to maintain uniformity at dual frequency, the CCP plasma etching systems become more complicated because of the electromagnetic and finite wavelength effects that deteriorate this uniformity. The main source of plasma nonuniformity at ultra-high frequency is the so-called standing wave effect.

At extra-high frequencies, RF voltage applied to the rear peripheral side of the showerhead is concentrated mostly at the edges and does not propagate to the center through the surface layer of the showerhead. At such frequencies, impedance of a plasma sheath is lower than the impedance on the surface of the showerhead. Therefore, RF power directly enters the plasma, specifically, the plasma sheath in the vicinity of the edges. After entering the plasma, the electrical field does not significantly penetrate the plasma but appears to be wave-guided in the sheath because Ohmic resistance—which in this case exists in the central part of the showerhead—is resistant to high frequency.

As RF frequency increases, the plasma-effective wavelength decreases, and therefore uniformity in the electrical field worsens. At 150 MHz, the showerhead, and, hence, the electrode radius, is larger than the quarter wavelength. In this case, RF power applied to the periphery leaves the process-side surface of the showerhead and propagates directly into the plasma sheath. Therefore, the RF voltage is wave-guided in the sheath that is adjoined to the surface of the showerhead. Because the plasma-effective wavelength decreases, the size of the showerhead becomes comparable with or less than the size of the wavelength. As mentioned above, at 150 MHz the showerhead radius is larger than the quarter wavelength, and in this case the phase change of the RF power from the edge to the center of the showerhead also becomes greater than the quarter wavelength. However, use of sufficiently high frequencies (short wavelengths) is accompanied by occurrence of some constructive and destructive interferences and skin effects. Because of constructive interference of counter-propagating waves from the opposite sides of the showerhead, the amplitude of the electrical field in the sheath increases at the showerhead center. This causes nonuniform distribution of the plasma density, with higher plasma density in the center than at the edges. Therefore, depending on the level of frequency, the finite wavelength produces nonuniformities, which are already problematic even for 300-mm showerheads, and become highly problematic for 450 mm showerheads. Thus, at the frequency of 150 MHz, a transition occurs from a traveling wave to a standing wave, whereby at each point along the showerhead radius, the RF power oscillates at a close phase. This phenomenon causes interference of the aforementioned wave with the counter-propagating waves reflected from the rear side of the showerhead.

The electrical field launched by the RF power and the plasma current introduced into the plasma becomes highly nonuniform, and the amplitude of the electrical field in the plasma sheath increases at the center of the showerhead (electrode). Several simulations made by different authors show that the electrical field is maximal at the center of the discharge and decays toward the edges, thereby following the Bessel function. Such changes in RF power distribution result in nonuniform RF power deposition into the plasma. As a result, the wafer treatment processes such as etching or deposition become nonuniform as well.

Local deposition of RF power in the plasma that occurs near the edges of the showerhead and the chuck (electrodes) leads to increase in local plasma density at the edges and is referred to as the skin effect.

For a CCP reactor with the geometry described above, argon plasma at an RF power frequency of 150 MHz (450 W) is sustained at a gas pressure of 50 mTorr. Under these conditions, ion flux density along the showerhead radius has the following values: the plateau around the center and up to a radius of 50 mm in the showerhead has ion flux density equal to $I=4.75\times10^{15}$ cm$^{-2}$ s$^{-1}$; the lower plateau in the area from radius 150 mm up to the edge that has a total radius of 240 mm has ion flux density equal to $I=1.75\times10^{15}$ cm$^{-2}$ s$^{-1}$; and the linear downfall branch has ion flux density I decreasing with radius R and expressed by the following formula:

$$I = 4.75 \times 10^{15} \text{ cm}^{-2} \text{ s}^{-1}(1-bR),$$

where b in the area with the radius from 50 mm up to 150 mm is ~$2.75 \times 10^{-2}$.

In the above structure, the finite wavelength effect weakens by decreasing the conductivity of the plasma-contacting surface of the electrode from the edge to the center of the electrode by applying a coating of dielectric material with variable density. In this case the RF wave can readily propagate through the surface of the showerhead dielectrics rather than through the plasma, especially at the center of the showerhead with the lowest conductivity. Thus, the peak of electron density at the center is diffused, and uniformity becomes smoother.

A drawback of this method is erosion and sputtering of the dielectric layer during the plasma process. As a result, plasma density distribution will change from process to process. Another drawback is contamination of the wafer by the sputtered material.

Other methods to suppress the effect of electromagnetic waves were proposed. For example, Japanese Unexamined Patent Application Publication (KOKAI) No. 2000-323456 published on Nov. 24, 2000, inventor A. Koshiishi, describes a plasma processing device wherein the showerhead consists of two parts, and the central part of the showerhead is made from a material of high resistivity for consuming more RF power due to Joule heat. As a consequence, electrical field intensity is reduced to a greater extent in the central part than at the peripheral portion of the showerhead. This effect is used to level the distribution of plasma density. However, the high resistivity part of the showerhead consumes too much RF power as Joule heat, and this reduces the efficiency of the device.

Another method to improve uniformity of the ion flux incident onto the wafer is to use the so-called slot antenna. U.S. Pat. No. 8,080,107 issued to W. Kennedy, D. Jacob on Dec. 20, 2011 describes a showerhead that consists of two to six separate segments arranged in a ring configuration, such as segments of single crystal silicon. However, Yang Yang and Mark J. Kushner (see *Journal of Applied Physics* 108, 113306, 2010) suggested splitting the RF power and power at these segments at different phases. At the segments, the phases of RF voltage alternate with 180°. The in-phase excitation retains the character of a surface wave propagating along the sheath and thus higher-density plasma is formed in the center. However the out-of-phase excitation shifts the maximum plasma density from the center to mid-radius. This middle-peaked plasma density may lead to excitation of a higher order of waveguide mode in the chamber. As a result, adjusting the uniformity of the plasma density becomes more difficult.

A drawback of this method is complicated real-time control of plasma uniformity, which includes tuning of phases by oscillating the phases of the segments or the phase swapping to shift the pick of RF power distribution from the center to the middle. The metal ceramic at the process-side surface of the showerhead deteriorates the plasma sheath, and the resulting sputtering and erosion contaminate the product.

Sansonnens and Schmitt (see L. Sansonnens and J. Schmitt, *Appl. Phys. Lett.* 82, 182, 2003) proposed to solve the problem of plasma-density nonuniformity by fabricating a Gaussian-shaped surface profile on electrodes covered with a thin dielectric plate to confine the plasma in a constant interelectrode gap. In this proposal, the dielectric lens should have a Gaussian shape in order to receive a uniform voltage across discharge and thus suppress the standing wave effect. However, manufacture of a showerhead with an accurate and smooth curvilinear surface is an extremely complicated, inefficient, and expensive procedure.

There exists many other methods and devices for improving uniformity of plasma density distribution in a plasma processing cavity of a CCP processing apparatus. However, in the majority of cases these methods and apparatuses are aimed at solving the above problem by managing the distribution of RF power.

In this regard, the transition to 450-mm wafer etching systems according to the above methods and constructions are less efficient than methods based on controlling gas distribution. There are large numbers of gas holes of the same geometry in the showerhead for introduction of a process gas from the gas reservoir to the plasma processing chamber. The diameter of the gas holes is approximately 0.5 mm. Separations between the neighboring gas holes may vary from 5 mm to a greater distance. The rate of gas flow through each hole is the same. However, changing the geometry at the exits of the holes on the process side of the showerhead is not recommended (refer to U.S. Pat. No. 6,333,601 issued to S. Wickramanayaka on Dec. 25, 2001). It is taught that with an increase in gas hole diameter to a value greater than 0.5 mm, the process plasma will penetrate deeply into the hole and will increase the erosion rate at the hole exit.

It is known that positive ions of plasma accelerate toward the showerhead surface and bombard the surface. These ions gain high energy, especially in the vicinity of sharp edges where the density of the electrical field is high, so that the bombardment of ions on the surface causes sputtering. According to this theory, the sputtering damage is higher at the exits from the gas holes since plasma density at these places is higher. This process causes an extruded erosion of the gas hole compared to the other areas of the showerhead, resulting in enlargement in the diameter of the gas holes. With the increase in diameter, the plasma tends to confine in the vicinity of exits from these holes due to multiple reflection of electrons from the walls of the gas holes. Accordingly, with the increase in plasma density, the erosion rate in the gas holes accelerates. This process leads to tapering of gas holes, and eventually the total process-side surface of the showerhead should be re-polished.

In order to avoid degradation at the gas hole exits, all gas distribution enhancing means should be provided at the back side of the showerhead. A conventional method (Lam® Research) is to divide the gas pressure reservoir into several separated zones. For example, as disclosed in US Patent Application Publication 20100252197 (inventors Babak Kadkhodayan and Anthony De La Llera; published Oct. 7, 2010), the gas pressure reservoir is divided into two zones, where about 60% of the gas holes are in the inner zone and preferably about 40% of the gas holes are in the outer zone. These zones are separated from each other by a gas sealing element such as an O-ring. Thus, in order to optimize etching uniformity, the inner and outer zones must undergo plasma etching at different flow rates of the process gas, but during wafer processing, such as plasma etching, the showerhead and cooler plate heat up, and differences in coefficients of their thermal expansion place high loads on the O-ring. The O-ring is also exposed to a highly corrosive etching gas. As a result, the O-ring deteriorates and contaminates the etching process. Because of gas leakage through the deteriorated O-ring, the pressure in each zone is out of control, and the etching process further deteriorates.

Instabilities in the RF circuit that may be caused by many reasons may lead to occurrence of high frequency in RF power. RF power with extra-high frequency tends to propagate from the cooler plate to the showerhead through gaseous gaps and the gas reservoir rather than through the Ohmic contact surface on the periphery. A valuable part of energy is diverted by this capacitor type of resistance from the Ohmic resistance at the periphery. The gas in the reservoir is also susceptible to breakdown. A corona discharge and arcing also occur in this area. Further, the above-described abnormal conditions lead to a phenomenon that is known as a hollow cathode discharge, which occurs on the developed surfaces at the entrances to the aforementioned gas passages and penetrates inside the gas holes. This leads to the loss of power and distortion in passage geometry, and hence, to instability in the technological parameters of the process. Under the effect of the hollow cathode discharge in the worst case, the gas flow becomes totally ionized or becomes the carrier of charged particles that are introduced into the process plasma and can be converted into miniature arcs. The arcing overheats the inner part of the gas passages of the exit areas and changes the structure of silicon. This leads to drastic lowering of the resistance of silicon to sputtering and etching. The heavy ions that are generated in the process plasma bombard and sputter the overheated edges of the gas channels. They even develop craters that may reach 3 mm in depth or more.

Radicals penetrate the passage deeper than the ions and expand the initial diameter of the channel by two to three more times. In other words, it can be assumed that the aforementioned degradation of surface of the showerhead that faces a plasma discharge in the etching process can be explained by interaction of the charged particles and radicals on the plasma-surface boundary of the showerhead.

A source of deterioration of the showerhead surface is ionization of gas flowing through each gas, which is capable under some conditions to generate its own plasma discharge. Such a discharge, in turn, generates ions that bombard the passage wall. Moreover, in case of mismatching of impedances in RF power supply with the process system, the ionized gas flow can be easily converted into an arc. Such mismatching can be caused by variations in chamber pressure, RF power, etc. In this case, a high-temperature torch that occurs at the exit of a gas passage causes thermo-erosion on the surface of the showerhead and funnels the gas passages by creating a nozzle effect in the vicinity of the border between the exit of the passage and the bulk plasma. A consequence of this effect is aerodynamic expansion, turbulence of gas ejected into the chamber, deterioration of uniformity in plasma density, and contamination of the process chamber and especially of the periphery of the showerhead by the deposited erosion products.

On the other hand, a corona discharge causes arcing in the gap on the gas input edges of the gas supply channels, i.e., on the side of the showerhead that faces the cooler plate. This arcing leads to destruction of the showerhead and hence to nonuniform distribution of the process gas in the plasma cavity and to contamination of the process gas and the product with particles of the showerhead material.

It should be further noted that the deterioration described above is not uniform and has a different degree in different areas of the showerhead. For example, gas-directing passages located closer to the periphery of the showerhead deteriorate faster and at a greater degree than in the center of the showerhead. This leads to shortening of the channel lengths in the peripheral part of the showerhead, which results in decrease in gas pressure near the peripheral areas of the process chamber. This, in turn, leads to nonuniformity of plasma.

In order to overcome the drawbacks of the known showerhead cooler systems, the inventors herein have developed a deterioration-resistant system of a showerhead with a gas-feeding cooler plate (hereinafter referred to as "system") for use in a semiconductor processing chamber that provides uniform distribution of plasma density in the working cavity of the semiconductor processing chamber over the surface of a semiconductor wafer having an increased diameter, e.g., up to 450 mm. This newly developed system is the subject of copending U.S. patent application Ser. No. 14/164,182 filed by the same applicants on Jan. 25, 2014.

It has been found that etching of large-diameter wafers, e.g., 450 mm in diameter, in a CCP plasma treatment apparatus requires that for generating plasma of sufficiently high density a power source of very high frequency up to 150 MHz be used. However, such high frequencies adversely affect distribution of plasma density and lead to nonuniformity of etching. In plasma-treatment apparatuses of the aforementioned type, plasma density depends on the radius of the showerhead and is maximal at the center of the plasma bulk, minimal at the periphery, and linearly decreases in the intermediate part toward the periphery.

In the deterioration-resistant showerhead cooler system of U.S. patent application Ser. No. 14/164,182 uniformity of plasma density is achieved by providing the gas holes of the showerhead with a special geometry that makes it possible to adjust gas permeability of the showerhead. In other words, at uniform permeability of the showerhead, plasma density is changed with the radius of the showerhead and, according to distribution of RF power, is maximal at the center of the showerhead, minimal at the periphery, and linearly decreases in the intermediate area.

In order to prevent the adverse effect of the hollow cathode phenomenon, the inventors herein offer to prevent the erosion of the nozzle and passage surfaces by coating these surfaces with a plasma-resistant coating. It has been experimentally found that coating with a thin film of yttrium oxide or silicon carbide is the best selection for accomplishing the above goal.

SUMMARY OF THE INVENTION

The invention relates to the field of semiconductor production, in particular to an atmospheric-pressure inductively coupled plasma (AP-ICP) torch system for application of protective coatings onto the walls of small-diameter holes and recesses present on flat surfaces, and more particularly to application of silicon carbide or yttrium oxide coatings, which are resistant to chemical corrosion and discharge breakdown onto the surfaces of conical recesses and inner walls of though gas holes of showerheads used in a showerhead/cooler system of a capacitive coupling plasma (CCP) apparatus. In particular, the invention relates to a torch system for application of yttrium oxide or silicon carbide coating by an AP-ICP method onto the surfaces of gas holes and conical recesses formed in a showerhead of a CCP apparatus intended for plasma processing of semiconductor wafers of 450 mm or greater diameter.

The torch system of the invention comprises an AP-ICP reactor for the formation of a plasma torch at the end of the plasma reactor that faces the showerhead surface to be treated. The purpose is to apply a protective coating onto the surfaces of the conical nozzles formed on the flat backside of the showerhead and onto the inner walls of the through gas holes that pass from the nozzles to the process side of the showerhead for supplying process gas to the plasma process chamber.

Attached to the object-facing end of the plasma reactor is a plasma torch focusing device that squeezes the torch to a needle, the tip of which can penetrate into the gas hole having a diameter as small as 0.5 mm. Compression and focusing of the torch tip is carried out with the use of a focusing gas, e.g., argon, which is injected into the torch from a plurality of capillary tubes that are tilted inward and downward to the surface of the torch and that participate in focusing the torch tip onto the surface of the treated object. A carrier gas that carries particles of the protective material, e.g., yttrium oxide, a discharge gas that participates in the formation and sustaining of plasma, and a cooling gas that protects the walls of the plasma reactor from overheating are fed to the torch system through the rear of the plasma reactor, which is opposite the torch exit end.

The AP-ICP torch system of the invention is also provided with a spectral optical system and a gas mass flow meter to control characteristics of the tip of the torch, such as size of the deposition spot formed by the material of the protective coating on the surface of the showerhead, and presence of a material other than the material of the protective coating on the tip of the plasma torch.

For compensation of changes in torch characteristics and for maintaining the torch tip under optimal conditions, the focusing device is moveable relative to the plasma in response to the command obtained from a spectral optical system and a mass flow controller via respective feedback.

The system also includes a holder for the object, in the illustrated case for a showerhead of a plasma treatment apparatus, wherein this holder is moveable in XYZ directions relative to the tip of the torch by respective drivers.

The motions of the focusing device and the holder with the showerhead are performed through the aforementioned feedback for maintaining the tip of the torch at optimal conditions with respect to the size of the deposition spot, prevention of overheating and melting of the ends of the capillary tubes that supply auxiliary gas to the focusing device, optimal content of the coating material vapor in the torch end, power supplied to the plasma reactor through a matching unit, etc.

A unique feature of the system of the invention is automatic adjustment of a noble gas consumption by sensing the flat surface areas, which do not need focusing and need to consume a smaller amount of gas, if any, and the recesses and openings of the surfaces that need to be coated and therefore require focusing of the torch and an increase in the consumption of an expensive gas.

BRIEF DESCRIPTION OF THE DRAWINGS

FIG. 6a is a three-dimensional view of the torch system of the invention.

FIG. 6b shows the torch focusing device from the top.

DETAILED DESCRIPTION OF THE INVENTION

The invention relates to the field of semiconductor production, in particular to manufacturing of a showerhead cooler system of a semiconductor processing chamber with uniform distribution of plasma density. More specifically, the invention relates to the atmospheric-pressure inductively coupled plasma (AP-ICP) torch system for application of an yttrium oxide or silicon carbide coating that is resistant to chemical corrosion and electrical discharge breakdown on the surfaces of the conical recesses and inner walls of through gas holes of the showerhead used in a showerhead/cooler system of a capacitive coupling plasma (CCP) apparatus. In particular, the invention relates to a torch system for application of a yttrium oxide or silicon carbide coating onto the surfaces of gas holes and conical recesses formed in a showerhead of a CCP apparatus intended for the plasma processing of semiconductor wafers that are 450 mm in diameter or greater.

Figure 1:
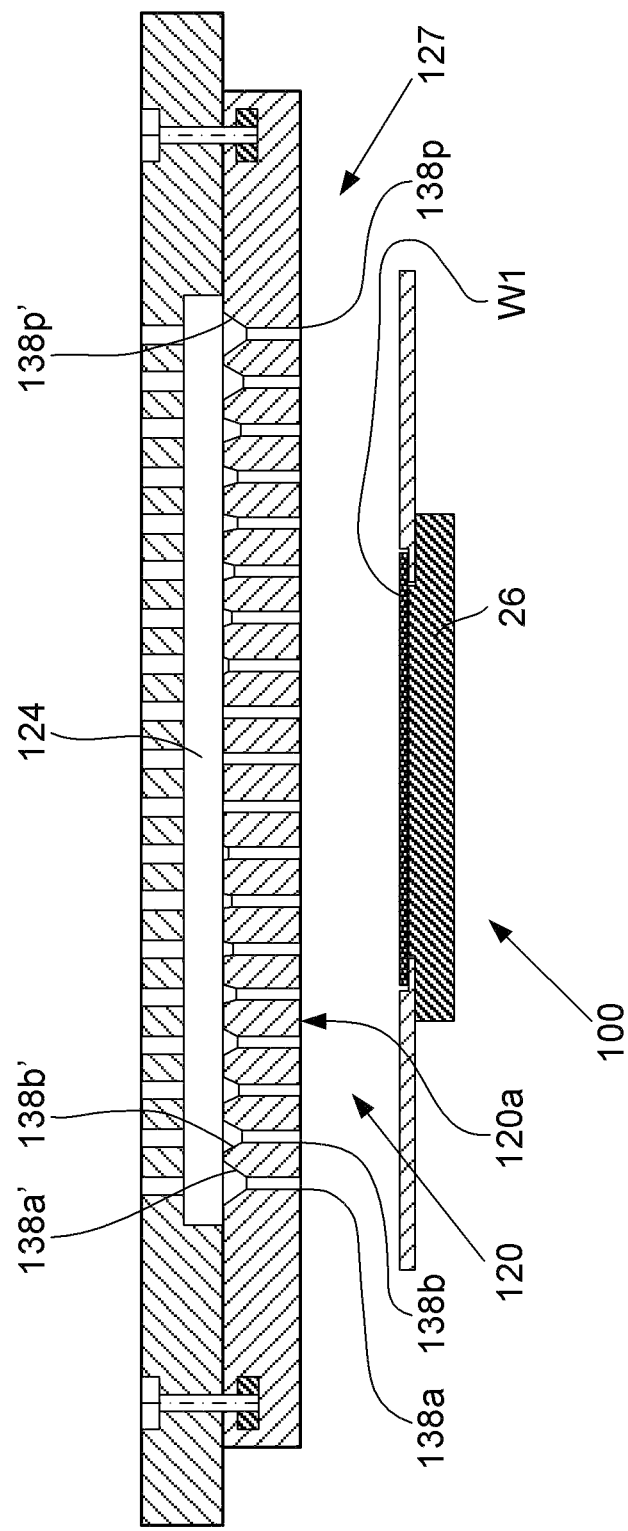
FIG. 1 is a sectional view of a showerhead cooler system that has surfaces on the back side of the showerhead requiring protection from chemical corrosion and electrical breakdown by means of protective coatings, such as yttrium oxide or silicon carbide, that are applied with the use of the torch system of the present invention.

FIG. 1 is a sectional view of the showerhead cooler system 100 that has surfaces on the back side of the showerhead requiring protection from chemical corrosion and electrical breakdown by means of a protective coating such as yttrium oxide or silicon carbide applied with the use of a torch system of the present invention.

Similar to a conventional shower head, a showerhead 120, which is an object of copending U.S. patent application Ser. No. 14/164,182, has through gas holes $138a_7 138b; \ldots 138p$. In the system 120 of the aforementioned invention, uniformity of plasma density is achieved by providing the gas holes 138a, 138b, ... 138p of the showerhead 120 with a special geometry that makes it possible to adjust gas permeability of the showerhead 120. In other words, this special geometry may change plasma density along the radius of the showerhead so that the density is maximal at the center of the plasma bulk, minimal at the periphery, and gradually decreasing in the intermediate portion toward the periphery.

In FIG. 1, reference numeral 111 designates an electrostatic chuck that support the product to be treated, in this case a semiconductor wafer W1 in a processing chamber 127.

As shown in FIG. 1, in the radial direction of the showerhead 120, the gas holes 138a, 138b, ... 138p are modified on the back side of the showerhead 120 and are converted into the nozzles 138a', 138b' ... 138p'. The patterns of the gas holes 138a, 138b, ... 138p have geometries that vary in the radial direction of the showerhead so that showerhead gas permeability is maximal at the periphery, gradually decreases towards the central area in the intermediate portion, and is the lowest at the central area.

Figure 2:
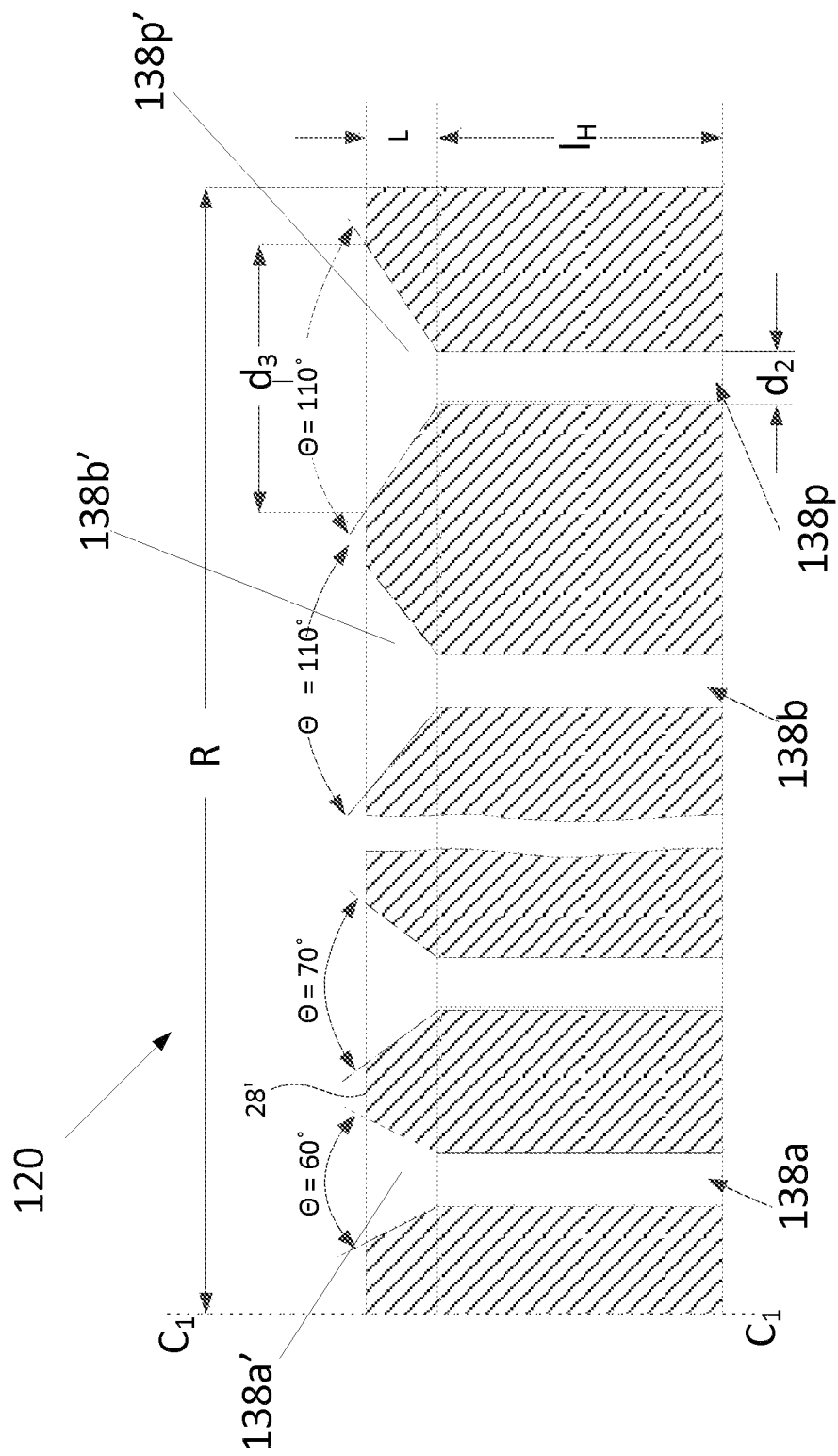
FIG. 2 is a fragmental view of the showerhead in FIG. 1 illustrating the geometry of the conical nozzles that are coated according to the method of the invention.

The geometry of the conical nozzles is shown in FIG. 2, which is a fragmental sectional view of the showerhead 120 shown on a larger scale than in FIG. 1. As seen from FIG. 2, the geometry of the nozzles 138a', 138b', ... 138p' is defined by angle θ of the funnel that gradually increases from the central area of the shower head toward the edges and depends on radial distance R of the showerhead from the showerhead central axis $C_1$-$C_1$.

The gas hole geometry described above uniformly increases gas flow from the peripheral zone and linearly through the intermediate zone and to the central area while the gas flow through the central zone stays unchanged. Such modification allows redistribution of the gas density and enriches plasma density and ion flux proportionally, with RF power losses thus equalizing the density of the ion flux responsible for uniformity of etching.

The geometry of the showerhead 120 which was modified according to the invention with conical nozzles 138a, 138b, ... 138p having angles increasing from the central area to the edges of the showerhead provides an increase in gas flow density from the central area to the edges. As a result, in spite of the same nonuniform distribution of RF power, the ion flux density and corresponding etching uniformity are equalized from the central area to the edges of the wafer.

However, as mentioned earlier, the geometry of some large nozzles may coincide with the geometry of the so-called hollow cathode that occurs in the intensive RF electron and ion systems and causes a phenomenon known as hollow cathode discharge. In other words, since the gas passages are modified, in the presence of the electrical fields used, for example, during plasma launching, the hollow cathode discharges may be triggered within the gas holes 138a, 138b, ... 138p, especially in the nozzle areas. In plasma processing, such hollow cathode discharges may lead to plasma power loss and particle generation due to erosion of the showerhead material. A parasitic plasma discharge can occur in the nozzle between the sidewalls of the nozzle.

The parasitic discharge triggered by these instabilities may occur during the above-described processes on the backside surface 120a of the showerhead 120, especially on the sharp edges of the entrance to the gas holes, and the nozzles increase this risk to a greater degree.

The electrons generated by this discharge can oscillate inside the cavity of the nozzle. The oscillating electrons cause multiple ionization, thereby generating parasitic dense plasma. The RF-powered parasitic hollow discharge comprises an origin of ions that can bombard the surface of the nozzle. This bombardment causes secondary electron emission and heating of the surface with the thermal electron emission. As a consequence, all of these electron emissions contribute to the total electron density and further enhance the hollow cathode discharge. Moreover, charged particles generated by the hollow cathode discharge carried along the gas passages together with the gas flow can penetrate through the gas passages into the process plasma, and this causes a local enrichment of the plasma density in the vicinity of the outlet of the passages that attract the high-energy ions from the bulk plasma during a half-cycle when the showerhead becomes negative to the plasma bulk. The bombardment of the edges at the exit of the gas passages by these ions develops craters that can be 2 to 3 mm deep. Products of erosion deposited on the surface of the showerhead contaminate the wafer.

In accordance with the invention of U.S. patent application Ser. No. 14/164,182 the above problem is solved by coating the backside of the showerhead, especially the entrance into the nozzle, the throat of the nozzle, and even partially the inner surface of the gas hole with an insulation coating that is characterized by high resistance to breakdown and chemical corrosion. This coating should also withstand thermal cycling during the plasma etching process when the temperature of the showerhead can increase to 800° C. The inventors herein have found that the coating material that can withstand the above-mentioned severe condition is yttrium oxide ($Y_2O_3$) or silicon carbide. In the system of the invention, the yttrium oxide or silicon carbide coating may have a thickness ranging from 2 µm to 10 µm.

This coating is considered to be an indispensible component of the system 120. The above-described geometry of the nozzles on the inlet side of the gas holes, which is used to provide uniformity in plasma density, is inseparably linked with this anticorrosive coating, which possesses high resistance to plasma and without which the showerhead with the above-described geometry of the gas holes cannot be realized.

Furthermore, the conical nozzle facilitates manufacturing and provides flexibility in converting the existing design to one with a higher flow rate without major redesign. Such geometry can be easily reproduced using standard countersink drill bits, e.g., with 10° to 60° convergent half-angles. The angle of the nozzle convergent cone section may range from 0 to 120°.

A function of the nozzle is to convert slow gas flow in the gas-accumulating reservoir into high-velocity gas flow through a gas hole. The flow of gas through the nozzle is driven from high pressure $p_1$ developed in the gas-accumulating reservoir 124 (FIG. 1) at the nozzle entrance toward low static pressure $p_2$ in the process chamber 127. The flow through a nozzle is different from the flow through a gas hole because of a gradual decrease of the cross-sectional diameter, whereby the flow rate through the nozzle may be about 2.75 times higher than the flow rate through the hole.

Of course, such funneling reduces gas resistance, and the depth of the nozzle should not exceed a threshold value at which permeability of the showerhead becomes so high that pressure in the process chamber as well as in the gas reservoir becomes unstable. As mentioned above, the flow of gas through the nozzle is driven by pressure difference between a pressure P1 developed in the gas-accumulating reservoir at the nozzle entrance and a static pressure P2, which is lower than P1 and exists in the process chamber. Due to the provision of conical nozzles, the flow rate through the conical nozzles may be about 2.75 times higher than the flow rate through the a conventional gas hole where the cone angle is zero.

Because the reactive component of the impedance of the gas reservoir is too high, almost all RF power should be transported through Ohmic contact with the cooling plate at the periphery of the showerhead. However, in case of mismatching when the frequency becomes too high, the gas reservoir becomes a total conductor and the transfer of RF power may occur mainly through the gas gap.

However, even though during mismatching of an RF generator the RF current fluctuations have much higher frequency than the critical frequency, such a situation is supposed to be withstood by correctly designing the gas gap. In other words, even arcing in the process chamber that abnormally lowers the reactive component of the gas gap impedance and causes high RF power leaks through the gap can be withstood if the gas gap has the correct dimension.

Because this gas gap is very sensitive to instability, in conventional showerheads the depth of the recess in a cooler plate is designed according to Paschen's Law, which also determines pressure in the gas reservoir. According to this law, the thickness of the gas layer can be determined so as to prevent occurrence of the electrical discharge during abnormal situations in an RF circuit. However, Paschen's Law is breached by the formation of funneled nozzles at the entrances of the conventional gas holes since the funnels increase the gas gap and thus exceed the critical breakdown thickness of the gap. Moreover, funneling increases the backside-surface area. The showerhead becomes more sensitive to different parasitic processes that could be tolerated before funneling.

Other detrimental effects of mismatching are exfoliation of the plasma chamber liner, contamination of the electrodes by the etching products, deterioration of vacuum conditions, occurrence of a stray arc corona on the sharp edges of the gas holes on the gas reservoir side, etc. The heavy ions of the stray discharge bombard the developed surface of the nozzles. During striking they cause ion-electron emission and release inner electrons from the bombarded surface. After gaining energy from the RF field in the gaseous gap between the showerhead and cooler plate, the generated particles strike the surface of the nozzle and cause secondary electron emission. Now the entire surface of the nozzles serves as a large secondary electron emitter (hollow cathode). As a result, breakdown provoked by microarcs appears somewhere in the RF circuit. Such parasitic hollow discharge that occurs in the gaseous gap is called a hollow cathode discharge. The hollow cathode discharge consumes a valuable part of the RF power, and may completely deteriorate the process plasma, shorten the lifetime of the showerhead, and violate etching purity. The gas flow ionized by the hollow cathode discharge becomes a carrier of some seed-charged particles that enrich the electron plasma density in the vicinity of gas hole exits. Furthermore, the plasma sheath in the vicinity of the hole exits deteriorates as well. High-electron density in the vicinity of the gas hole exits attracts high-energy ions from the process plasma. These ions bombard the sharp edges of the holes and cause sputtering of the silicon. At the same time, highly active radicals of the process plasma provide intensive etching, and the edges of the holes are quickly eroded, thus deepening the conical geometry by 3 mm. The eroded silicon deposited on the periphery of the showerhead creates black silicon that contaminates the wafer. The charged species from the process plasma meet the ionized gas that is ejected from the gas holes, enrich the weakly ionized gas flow that exits into the process chamber, and converts the flow into a high-temperature torch that destroys the gas hole exits on the process-side of the chamber.

Thus, under mismatched, the system of the invention for improving uniformity of plasma density by controlled gas distribution becomes counter-productive and may worsen the plasma etching process.

Funneling, alone, may be insufficient without protecting of backside of the showerhead and especially the surfaces of the nozzles and partially the inner surfaces of the gas holes by coating these surfaces with a film that is highly resistant to breakdown, plasma chemical corrosion, flaking, and thermal shocking. This coating should also be applied onto the inner surfaces of the gas holes as deeply as possible.

It has been experimentally found that a chemical plasma corrosion coating with a thin film of yttrium oxide or silicon carbide is the best selection for accomplishing the above goal.

As mentioned above, in case of incorrect design the geometry of the showerhead gas holes proposed by the present invention may violate critical dimensions of the gas gap and induce fatal drawbacks such as parasitic hollow cathode discharge on the surfaces of the nozzles. Therefore, these surfaces as well as the inner surfaces of the gas holes must be protected by a thin insulation layer that allows RF power to propagate through the hole but prevents damage of the surface with breakdown in the area of the gas gap. Without such protection, the lifetime of the showerhead may be shortened to a level unacceptable for industrial application.

In addition to protection from parasitic discharges, such an insulating layer must withstand thermal cycling during the etching process wherein temperature of the showerhead quickly up to 600° C. and then drops to room temperature. Moreover, the insulating layer also should withstand erosion from the highly corrosive process gases. One of the materials capable of withstanding such severe conditions is $Y_2O_3$. Conventional coatings used for plasma etching application are porous, have low adhesion, and have a high risk of exfoliation. With reduction in the size of the deposited material from microns to nanomicrons, adhesion and density are improved because of the increase in surface energy.

Nanocoating with $Y_2O_3$ is much more effective for such protective coatings because they are corrosion resistant and at the same time protect the showerhead from arcs and hollow cathode discharge.

Figure 3:
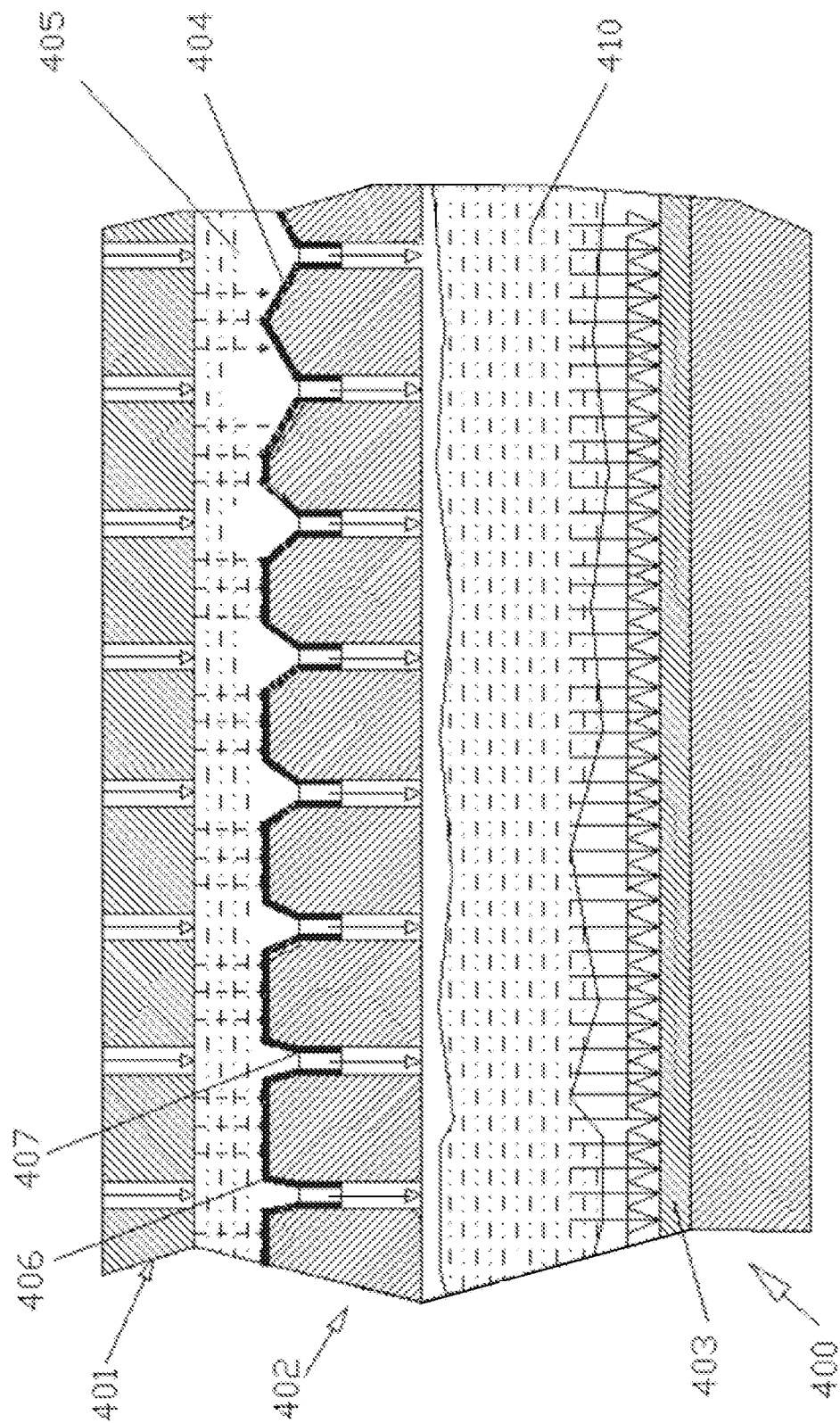
FIG. 3 is a fragmental view of the showerhead system illustrating positions of the protective coating that is applied onto the backside of the showerhead with the use of the torch system of the invention.

$Y_2O_3$ coating has the following properties:
Porosity: 2%
Density: 5.0 g/cc
Thermal conductivity: 8-12 W/m ° K
Hardness: >500 HV 0.3 (by cross-section) Ra (μm) 120
Coefficient of thermal expansion: 8 to 9 μm/m/C
Dielectric constant: 12 to 13 (ASTM D 159)
Specific electrical resistance: 10 exp 15 Ohm cm
Adhesion: 7,000 psi
Breakdown voltage (V/mm): 2.75×10 exp 6 V/cm
Breakdown strength: 3.8 MV $cm^{-1}$
Leakage current density: 10 exp (−6) A/cm 2 at 1.3×10 exp 6 V/cm
Impedance: I, kOhm 1 kOhm
Corrosive resistance: Lifetime: 1000 h FIG. 3 is a fragmental view of a showerhead cooler system 400 of a semiconductor processing chamber comprising a cooler plate 401 and a showerhead 402, the backside of which is coated with a protective coating 404. Reference numeral 403 designates a semiconductor wafer located in the processing chamber S. The protective coating 404 comprises, e.g., a nanocoating of $Y_2O_3$ prevent parasitic hollow discharge in a gas reservoir 405 as well as sputtering of the outlets of the gas holes 407 in the process plasma 410 and contamination of the wafer 403 by the sputtering products. Nanocoating 404 is applied to the surfaces of the nozzles 406, especially to the sharp edges, i.e., to the outer surfaces and the inner surfaces 407 where there is high probability of arcing with the hollow cathode discharge. However, coating layers on the sharp edges are less adhesive and more susceptible to exfoliation under the effect of mechanical stress and/or the thermal cycling. If such coatings exfoliate, the exposed surfaces are no longer protected against arcing. The inner walls of the gas holes also should be coated with a coating layer at least to the depth of 5 mm from the surface of the showerhead 402. A vacuum deposition method, e.g., magnetron sputtering, is suitable for application of a very dense and thin $Y_2O_3$ film, but this method is not suitable for application of $Y_2O_3$ coatings on large surfaces of a 600-mm-diameter showerhead needed for processing a 450-mm wafer.

Moreover, such thin films cannot be deposited on the inner surface of a gas hole. Because large vacuum chambers that may be required for vacuum deposition on such large surfaces would be very expensive, it seems to be more advantageous for the purpose of the present invention to use chamberless atmospheric methods of coating, which may appear to be cost effective for such applications. Usually, consumable parts such as showerheads, focus rings, etc., are coated by means of the conventional DC atmospheric plasma spray coating method (Sulzer Metco (US) an Praxair Surface Technologies, Inc). The precursor to such coatings is the commercial nanopowder made by Inframat NanoAmor and US Research Nanomaterials, Inc.

However, $Y_2O_3$ coatings applied according to the above method are too rough and may be subject to exfoliation. $Y_2O_3$ has high enthalpy, and therefore a conventional coating technique such as a DC atmospheric plasma spray coating cannot convert nanopowder into a vapor because of the short resident time in a high-temperature area. The length of the arc and the supersonic speed of the nanoparticles limit the time. The cathode arc generated by the spray gun cannot be long enough. The arc generates a supersonic speed for all species captured by the arc. As a result, the nanopowder can be converted into melting droplets that in flight immediately aggregate into large clusters and produce splat deposition, with a splat size of approximately 2 microns. Such large particles can clog the gas holes. A splat coating is also characterized by low adhesion, high porosity, and a high risk of exfoliation, especially under the effect of thermal shock which occurs during fast heating of the showerhead by the process plasma and fast cooling for removing the wafers after completion of the etching process. The borders of the splats are weakly bonded to each other and to the surface of the showerhead. Being mechanically independent because of absent surface energy, the assembly of the splats can be easily cracked and exfoliated during thermal shock. Thermal shock occurs when the temperature of the showerhead increases to 600° C. and the quickly drops to 20° C. The splat deposition on the sharp edges at entrances to the holes is especially unstable and exfoliates first. The exfoliated particles captured from the holes by the gas flow are carried by the flow and are injected into the process plasma bulk. The exfoliated particles develop dust plasma that contaminates the surface of the wafer as well as the manufactured microchips. The porous structure of the coating also accumulates humidity and byproducts of the plasma chemical reaction. Pumping of such contaminants from the closed space inside the gas reservoir through the narrow gas holes is time-consuming and increases the manufacturing cost. The melted droplets can block the gas holes, thus changing the nonuniform gas distribution that was developing by the funneling of these holes. It is understandable that for deeper penetration into the gas holes, the nanopowder should be delivered as vapor. Moreover, strong bonding of the deposited $Y_2O_3$ inside the holes is possible only if heat is delivered into the holes and provides a surface temperature up to 240 to 250° C. Furthermore, proper coating requires total vaporization of the precursor that is possible for a long resident time in a high-temperature area.

The inventors herein have found that the problems inherent in the deposition methods described above can be solved by using an AP-ICP torch such as the Tekna Plasma Systems PL-35 Induction Plasma Torch. The AP-ICP torch is much longer than the DC arc and provides a longer resident time of nanopowder in a high-temperature plasma plume (several milliseconds to hundreds of milliseconds) as compared with DC plasma spray. The nanopowder can be injected into the torch at a low speed, and the melted droplets are turned into vapor.

Figure 4:
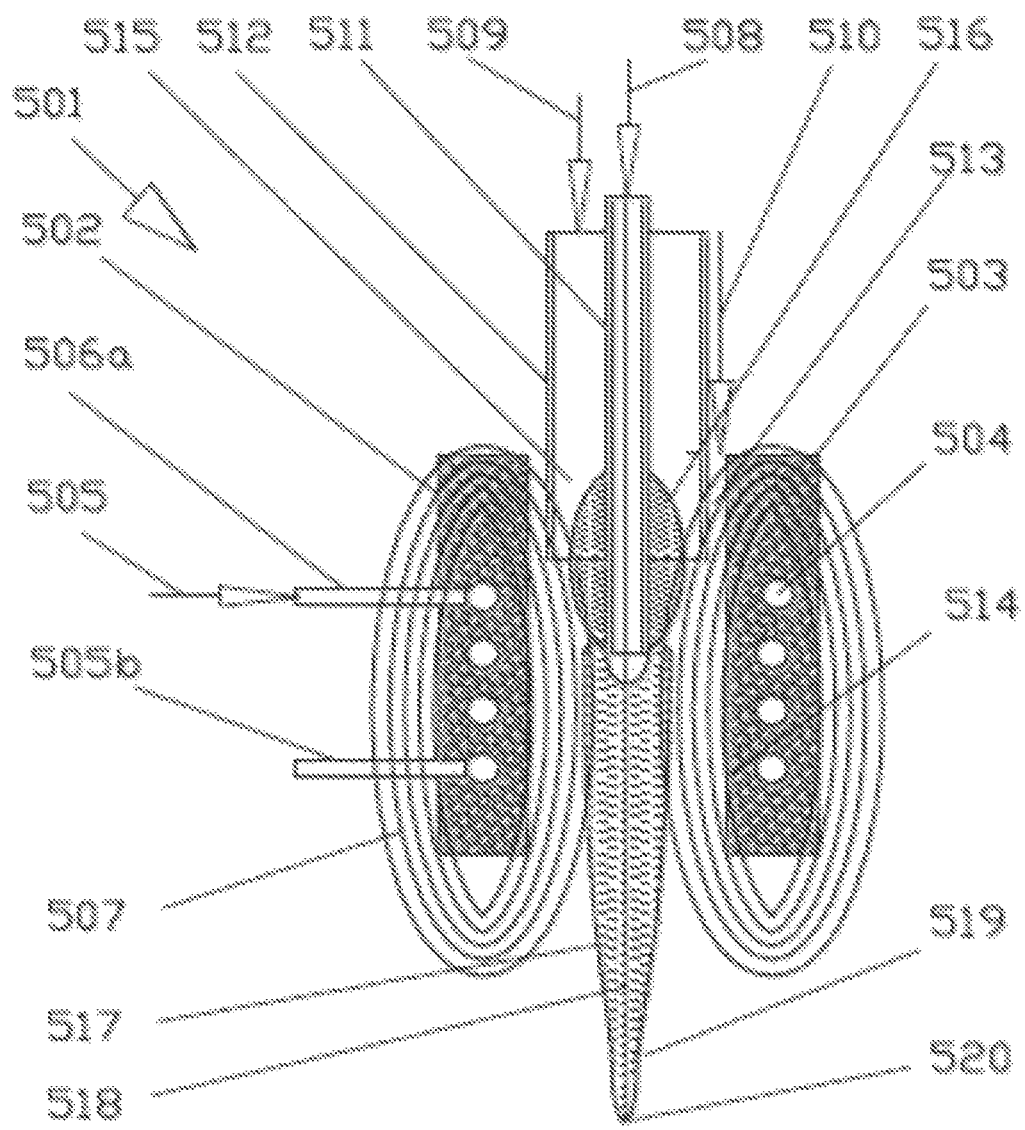
FIG. 4 is a sectional view illustrating an example of a plasma-torch generation part of a known plasma-torch generation apparatus.

An example of the Tekna system, which is nearest in its structure and principle of operation to the device of the invention, is shown in FIG. 4 (http://www.tekna.com/technolony/plasma-state/). The known Tekna torch system, which as a whole is designated by reference numeral 501, includes a plasma reactor 502 made from a ceramic (porcelain) tube 503 with a water-cooled induction coil 504 transmitting the RF power 505 through tubular terminals 506a and 506b incorporated inside the tube 503 for inducing an RF magnetic field 507 inside the reactor 502. Three different gas flows 508, 509, and 510 of a noble gas, usually argon, are directed through different coaxial quartz or ceramic compartments of the torch system 501. The carrier gas 508 is delivered through a central or injection tube 511. The discharge gas 509 is delivered through an intermediate tube 512, and the cooling gas 510, referred to as sheet gas, is delivered through a narrow space 513 between the intermediate tube 512 and an inner wall 514 of the outer ceramic tube 503. As a result, a closed annular path referred to as a discharge 515 formed between the central tube 511 and the intermediate tube 512 is filled with the discharge gas 509 at some pressure appropriated for launching a glow plasma discharge 516. The plasma discharge 516 appears during an outside ignition (not shown) when electrons are "seeded" inside the discharge 515 from an external spark igniter such as a Tesla coil (not shown). The RF magnetic field 507 generates electrical current, known as Eddy current, by accelerating ions and electrons in the discharge 515. At some level of the RF power, the RF magnetic field 507 becomes strong enough to heat the discharge 516 by Ohmic resistance to a high temperature, e.g., up to 10,000 K. Once the ionizing temperature of the noble gas is reached, the glow discharge 516 becomes self sustained by maintaining a partially ionized high-temperature torch 517 due to the energy coupling between the load coil 504 and this discharge 516. (This phenomenon will be explained in more detail later). Overheating of the inner wall 514 of the outer ceramic tube 503 of the torch system 501 is prevented by cooling with gas flow 510, which is introduced tangentially and in a swirling mode (swirling directing means is not shown). In order to provide swirling, the cooling gas 510 is fed with a high flow rate. The precursor in the form of a train of nanoparticles is transported by a carrier gas 508 via the narrow injection tube 511. This tube directs nanoparticles to a central part in the direction of an axis 518 into a high-temperature zone of the reactor that is surrounded by the annular-shaped induction region of the torch 517. The nanoparticles that are moving in the vicinity of the axis 518 melt into droplets. If RF power is strong enough, then in addition to sustaining the torch, it is also capable of vaporizing the nanoparticles, such as nanoparticles $Y_2O_3$, into a flying material with high enthalpy.

Generally, the energy is transferred from the induction zone where by conduction, convection, and radiation the torch 517 is developed into a body with a tapered end. Because the train of nanoparticles is generally confined within the central part of the torch 517, contamination of the inner wall 514 by the nanoparticles and contamination of the torch 517 by the constituents of materials of the reactor 502 are minimized.

Due to magnetic pinching, the geometry of the tapered torch 517 ends up with a tip 520, which is characterized by very low sharpness. Such pinching compresses plasma in the vicinity of the axis 518 of the reactor 502. After passing from the induction zone into a space free from the electromagnetic field, the torch 517 continues to be compressed in a radial direction due to the magnetic force generated by its own current. The inner electrostatic forces redistribute the species in a cross section of the torch 517. The positive ions generated in the vicinity of the axis 518 are directed along this axis, and the flight of neutral atoms passing through the reactor 502 is unaffected, while the flight of negative species is deflected outwardly toward the periphery of the reactor 502 and away from the axis 518 of the reactor 502. As a result, an electron cloud that surrounds the high-temperature core of the torch is formed and moves paraxially and spreads out radially outward from the torch boundaries.

The torch 517 carries negative species (not shown) that increase its boundary 519 and charge the substrate (not shown). During mechanical scanning of the substrate relative to the torch 517, the electrons of the tip 520 charge the surface of the substrate, and since during operation the substrate moves relative to the torch, the charges on the moving surface create an electrostatic force that bends the tip 520. The bending phenomenon will be explained later with reference to FIG. 7d.

Because the tip 520 of the torch produced by the Tekna AP-ICP torch system described above is relatively large, this system is more suitable for coating flat surfaces, e.g., a backside surface of a showerhead rather than the inner walls of the gas holes.

In order to improve the Tekna AP-ICP torch system, the inventors herein proposed a special focusing device that contracts the tip of the atmospheric plasma torch and imparts to it a needle shape. At the same time, the proposed focusing device eliminates surface charging produced by the torch. More specifically, the modified Tekna AP-ICP torch system of the present invention is suitable for application of a protective coating of yttrium oxide or other oxide onto the surfaces of conical nozzles and on the inner walls of gas holes.

Another distinguishing feature of the torch system of the invention is cost-effectiveness since an expensive noble gas, e.g., argon, which is used as a focusing gas for focusing the torch tip, is consumed very economically and is supplied only when the nozzles and gas holes of the showerhead are aligned with the tip of the torch. In other words, when depositing a protective coating only onto the inner walls of the gas holes, the surface area of which is much smaller than the entire flat backside of the showerhead, the aforementioned feature of the system of the invention makes it possible to minimize the consumption of the noble gas.

Figure 5:
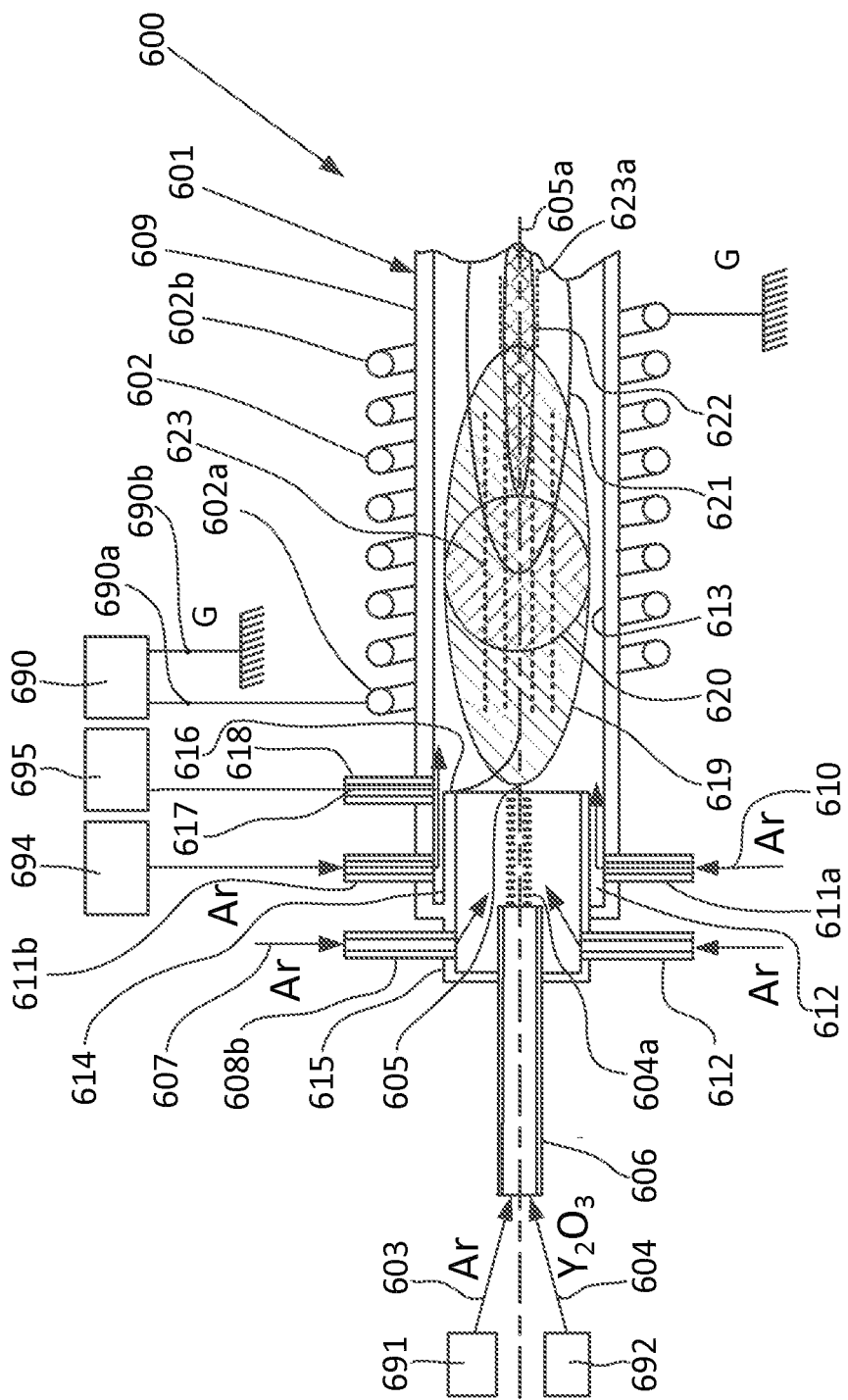
FIG. 5 is an axial sectional view of a plasma-generation part of the torch system of the invention.

The modified Tekna AP-ICP torch system of the invention (hereinafter referred to as the "torch system"), which in general is designated by reference numeral 600, is shown in FIGS. 5 and 6a, where FIG. 5 is an axial sectional view of a part of the torch system and FIG. 6a is a perspective view of the torch system.

As shown in FIGS. 5 and 6a, the torch system 600 comprises a plasma reactor 601 (quartz tube) generating an atmospheric plasma discharge by using an inductor or induction coil 602 that surrounds a plasma reactor 601. The inductor 602 comprises several spiral turns, the number of which depends on the RF frequency, and is joined to an RF generator (not shown) through a matching network 690 with a high-voltage terminal 690a and a ground terminal 690b grounded at G. The first turn 602a, referred to as a high-voltage turn, is connected to a high-voltage terminal 690a of the matching network 690, and the last turn 602b is grounded at G.

Three argon gas flows are injected into the plasma reactor 601. The first is a carrier gas 603 that is delivered from a mass flow controller (MFS) 691 communicating with an argon reservoir (not shown).

The MFS 691 may comprise a Brooks Instrument GF81 High-Flow MFS which can be used for gas flow rates up to 300 slpm, making it ideal for high-flow applications, especially a gas-focusing capillary system 624 (FIG. 6A) which is described below and is characterized by high gas consumption.

The carrier gas 603 serves for injection of gas that carries nanoparticles 604 into the axial zone 605 of the plasma reactor 601 through an inner tube 606 axially connected, e.g., welded, to the reactor 601. The nanoparticles 604 are delivered from a powder feeder 692 communicating with a nanopowder storage (not shown). A second gas flow 607, referred to as a central or discharge gas (argon) flow, is injected through two tubes 608a and 608b welded tangentially to the wall 609 of the plasma reactor 601. This central gas 607 is delivered from a mass flow controller 691 communicating with the same argon reservoir (not shown). Reference numeral 605a in FIG. 5 designates the axis of the reactor 601. This central gas flow 607 is tangentially swirling. Another mass flow controller 694 communicating with the same argon reservoir (not shown) delivers another gas flow 610. This flow 610 is injected into the reactor 601, referred to as an auxiliary, cooling or sheet gas. This gas is injected through two tubes 611a and 611b, which are also welded tangentially to the wall 609 of the plasma reactor 601. The swirling occurs in a very narrow space 612 (which is less than 0.25 mm) that is formed between the inner wall 613 of the reactor 601 and an outer wall 614 of an intermediate tube 615 welded axially to the plasma reactor 601 and immersed into this reactor 601.

Thus, at the gas and particle inlet side, the plasma reactor 601 has three concentric tubular bodies, i.e., the inner tube 606, the intermediate tube 615, and the rear end of the cylindrical reactor 601. The carrier gas flow 603 is directed to the reactor 601 through the inner tube 606; the central or discharge gas flow 607 is directed into an annular space between the inner tube 606 and the intermediate tube 615; and the cooling, auxiliary, or sheet gas flow 610 is directed into a space 612 between the inner wall 613 of the reactor 601 and an outer wall 614 of an intermediate tube 615. Such space serves as a tunnel for vortex generation.

Although both gas flows 607 and 610 are swirling, the first swirls approach the axial zone 605 of the plasma reactor 601. But since this swirling originates in a very narrow space 612, the direction of the velocity vector of gas molecules in the flow 610 is changed even after the molecules leave the space 612. Being off the axis 605a of the plasma reactor 601, the cooling gas flow 610 is pressed against the inner wall 613 and slides along the inner wall 613 of the plasma reactor 601. The flow rate of the cooling gas 610 is chosen so as to provide swirling velocity such that it prevents mixing of the swirling gas flow with the flow of the discharge gas 607 and participation of this gas in the plasma discharge but merely to cool the inner wall 613 of the plasma reactor 601. Such spiraled gas flow 610 is injected from the space 612 not the reactor 601 close to the position of the first turn (high voltage turn) 602a of the induction coil 602. The cooling flow 610 also carries the seed electrons 616 emitted from a tungsten needle 617 of the igniter 618 welded to the wall of the plasma reactor 601 above the edge of the intermediate tube 615. The seed electrons 616 are generated in a spark developed by the Tesla transformer 695 (mechanism explained earlier) connected to the needle 617 through the igniter 618. The seed electrons 616, which are delivered by the cooling gas flow 610 to the high-strength zone of the electrical field in the vicinity of the high-voltage potential of the first turn 602a of the inductor 602, ionize argon in this area and initiate a capacitive discharge 619. An axial RF magnetic field generated by the inductor 602 is converted to an RF electrical field that is strong enough to provide acceleration of the electrons of the capacitive discharge 619. Due to inductive coupling between the glow discharge 619 and the inductor 602, the RF magnetic field sustains the discharge, converting it into an inductively coupled plasma (ICP) discharge. Moreover, due to such coupling, a major amount of RF power applied to the coil 602 is transferred to the ICP discharge 619, providing inductive heating of the discharge. At some level of RF power, the magnetic field transfers so much power that the glow ICP discharge can be converted into a high-temperature, high-pressure arc. As a result, a highly pressurized plasma ball 620 with a temperature as high as 10,000K is developed on the axis 605a inside the plasma reactor 601 in the vicinity of the inner area of the inductor 602. This plasma ball 620 consists of (1) exited atoms and ions, (2) fast electrons generated by the discharge and accelerated by the RF electromagnetic field, (3) and neutrals. Slow electrons are also born in ionization. Due to recombination of the exited atoms, the plasma ball 620 emits UV radiation. A highly pressured plasma ball 620 releases its pressure by ejecting a plasma torch 621. Slow electrons move together with the plasma torch. As known, in low-pressure plasma, some equilibrium exists between the positive and negative species. Such plasma is usually neutral. However, due to the presence of slow electrons in high-pressure plasma, negatively charged species prevail over the positive ones.

The flow rate of the carrier gas flow 603 is used for adjusting the rate of deposition by delivering an appropriate amount of nanoparticles 604 and by injecting them into the gas discharge 619. Both the carrier gas 603, which cools the discharge 619, and the nanoparticles, which absorb heat in order to be vaporized on the fly, can suppress the discharge. In order to sustain the torch even at a high rate of deposition, the flow rate of the gaseous medium, i.e., a discharge gas 607, should be increased simultaneously with the increase in RF power applied to the inductor. However, the flow rate of the cooling gas is separated from the discharge gas flow 607 and in addition to cooling prevents high temperature of the plasma ball from reaching the inner wall 613 of the plasma reactor 601; if this were not prevented, the wall 613 could melt. The inventors herein have found that a 1.5 ratio between the flow of the discharge gas 607 and the cooling gas 610 is sufficient for protecting the reactor walls from damage by the heat of the plasma ball 620. If flow of the cooling gas 610 is too slow, no swirling effect is achieved. Without swirling the cooling gas will not have an efficient contact with the inner wall 613, and the wall 613 will melt. On other hand, if the cooling flow 610 exceeds the discharge gas flow 607 by more than 1.5 times, the laminar flow of the cooling gas 610 becomes turbulent and disrupts the plasma ball. Such turbulence cuts off the cooling flow from the wall 613 creating a stagnating area called a "low-pressure pillow" of high thermal conductivity. This pillow allows the high-temperature ball area to spread and approach the inner wall 613 of the reactor and thus melt the inner wall. As mentioned above, the RF power has a threshold that converts the ICP discharge in the discharge 619 into a high-temperature plasma ball 620. The size of the ball depends on the RF power and the flow rate of the discharge gas flow 607. At abnormal RF power such size becomes commensurable with the inner diameter of the plasma reactor 601, and the limited cooling gas flow 610 cannot develop a temperature barrier to protect the wall. The value of the RF power that determines the rate of deposition of $Y_2O_3$ particles characterized by high enthalpy cannot exceed the destructive level. Even a limited amount of nanoparticles per second can be vaporized because the cooling gas flow 610 is limited by turbulence that can separate a cooling gas flow 610 from the wall 613 and disintegrate the discharge. As a result, the plasma ball 620 is sustained in the axial zone of the reactor due to a magnetic hydrodynamic balance among the RF magnetic field, the central gas flow 607, and the cooling gas flow 610. Being under high pressure, the plasma ball 620 ejects a downstream torch 621 that propagates along the axis of the plasma reactor 601. At the same time, the RF magnetic field pinches this torch 621 into a plasma filament 622 in the vicinity of the axis 605a. An increase RF power lengthens the filament 622. The torch consists of the supersonic flow of positive and negative ions, neutrals, and excited molecules. A recombination on the fly supplies the torch with electrons that charge the torch negatively. Such electrons are repelled from the axial part of the torch where the negative charge is very high and are collected outside the filament 622, thus creating a shell that consists of an electron cloud (not shown) that moves paraxially and negatively charges the substrate (not shown). The nanoparticles 604 injected through the tube 606 axially into the reactor 601 as a mixture 604a with the carrier gas 603 are converted in the vicinity of the high-temperature plasma ball 620 into the flow of the melted droplets 623. However, as the molten droplets 623 of these nanoparticles are carried away by the torch 621 from the plasma ball in the direction of the axis 605a, they have enough resident time to be vaporized in a high-temperature area and become a vapor flow of $Y_2O_3$.

A distinctive feature of the torch system of the invention is its plasma torch focusing device 624. The focusing device 624 contains a gas focusing plasma lens 625 (FIG. 6a) that includes the gas communication tubes 628a, 628b, 628c, and 628d. The gas communication tubes are welded to a hollow doughnut-like body 627 that is arranged concentrically outside the plasma reactor 601. The doughnut-like body 627 serves as a focusing gas manifold that is connected through the gas communication tubes 628a, 628b, 628c, and 628d to an argon bottle (not shown) through a mass flow controller 725 (FIG. 7c). By means of the gas communication tubes, argon is distributed uniformly inside the manifold. Each gas communication tube serves also as a holder joined to a platform (not shown in FIG. 6a) that holds the total gas focusing system 624 and provides its automatic aligning and positioning relative to the axis of the torch and to the substrate, respectively. Besides the gas-supplying communication tubes 628a, 628b, 628c, and 628d, the focusing device 624 includes a plurality of gas ejecting capillary tubes, such as tubes 626-1, 626-2, and 626-n which are welded to the bottom of the doughnut-like body 627 obliquely to the axis of the doughnut 627 (FIG. 6a). The capillary tubes that serve as the ion injectors are assembled in a multitubular cone that is tapered to the axis of the torch system 600. The capillary tubes are distributed with angular uniformity in the circumferential direction. The manifold distributes argon as a focusing gas equally to the capillary tubes. In order to provide tangential injection of the generated ions into the torch 621 (the mechanism of generations of ions is explained later), the ion injectors and, hence, the capillary tubes are inclined to the axis of the plasma reactor 601 at an angle C in the range of 20 to 30° for injecting the focusing gas onto the torch tangentially to the torch surface. The exits 630 of the capillary tubes are tightly bound into a plurality of bundles to generate an argon shower. This shower is converted into an ion shower surrounding the torch 621. Therefore, the exits of the capillary tubes are positioned closely to the tip 629 of the plasma torch 621. In order to prevent melting of the capillary tube ends 630, the exit ends of the capillary tubes form a circle having a diameter that exceeds the cross-sectional diameter of the tip 629 of the torch 621. On the other hand, the exit ends of the capillary tubes must be close enough to the tip 629 of the torch 621 in order to provide ionization of molecules of argon and a free pass of the generated ions. Therefore, a specific distance along side the axis of the torch 621 is required for optimal position of the exit ends of the capillary tubes relative to the torch 621 in order to satisfy thermal as well as ionization conditions. The welding angle is designed to provide tangential injection of the generated ions into the tip 629 of the torch 621. Finally, an axial position is chosen to provide ion compensation exactly in the tip 629 of the torch 629 in a special area distanced from the surface of the substrate. The focused end of the tip with a minimal cross-section is called a crossover. Positioning of the crossover exactly on the surface of the substrate is determined as a fine focusing. Thus, the focusing distance is physically the distance of the ends of the capillary tubes to the surface of the substrate if the crossover is positioned on this surface. The inventors found that this distance is approximately 7 to 8 mm. The diameter of the circle created by the ends of the torch is 5 to 6 mm, and the angle is 30 degrees to the axis of the torch. This diameter D determines the distance D/2 of the ends of the capillary tubes from the axis of the torch (FIG. 7c). Positive ions are generated by ejecting of the flow from the capillary tubes 626-1, 626-2, 626-n and directing the flow into an electron cloud (not shown) that moves paraxially in the vicinity of the tip 629 of the torch 621. This electron cloud surrounds the highly negatively charged atmospheric torch 621. The aforementioned distance is short enough to generate ions and provides a free path of ions to the torch in order to neutralize the spatial electron negative charge. At the same time, the heat irradiated by the torch is used for preheating the flow of argon ejected from the capillary tubes 626-1, 626-2, 626-n (FIG. 6a) to prevent cooling of the tip 629 of the torch 621. However, approach of the end 630 of the capillary tubes to the torch 621 should be limited to prevent melting of the capillary tube ends 630.

Figure 6C:
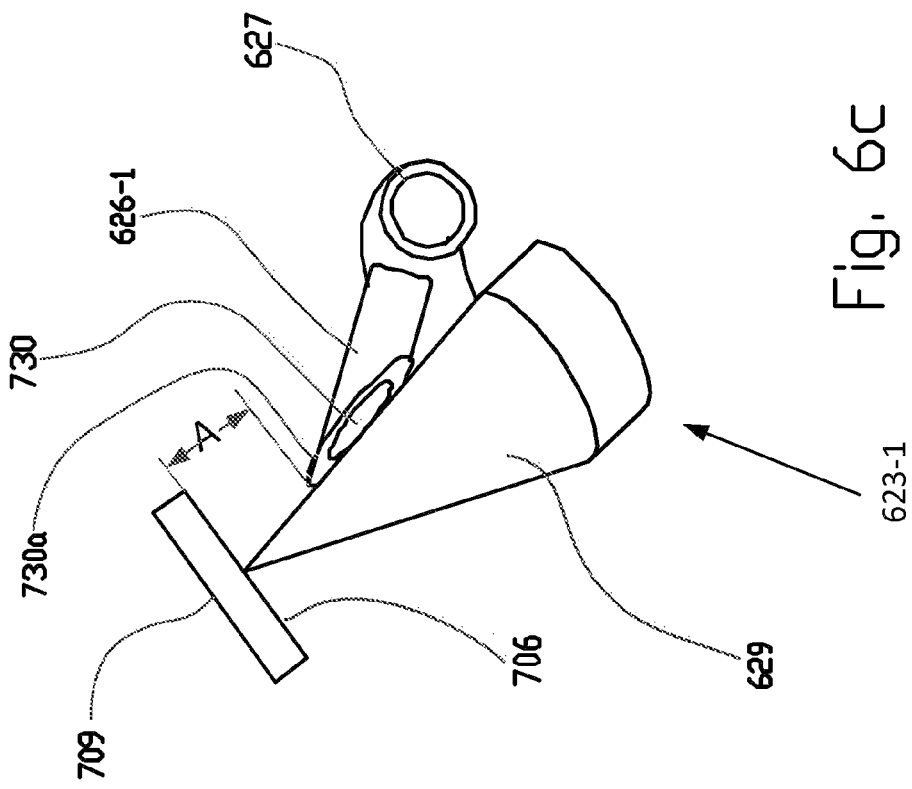
FIG. 6c is a three-dimensional view of one capillary tube that shows the oblique cutoff on the end of the capillary tube.

FIG. 6c shows just one capillary tube 623-1 welded to the hollow doughnut-shaped manifold 627. The part of each capillary tube closest to the tip 629 of the torch (FIG. 6a) is a bottom edge 630a that can be melted if it occurs in a high-temperature zone. As mentioned above, all bottom edges are positioned on a conditional circumference with diameter D. This is shown in FIG. 6b, which shows the focusing system from the top where reference numeral 629 designates the conical tip. As mentioned above, the end 630 of each capillary tube has an oblique cutoff (FIG. 6c) in order to conform the conical shape of the torch tip 629 and provide maximal approach of the capillary tubes to the tip 629 for reducing escape of the generated ions. In other words, the cutoff end of each tube is near the surface of the plasma torch but does not contact it. To prevent melting of the capillary tubes, the oblique cutoff is made at an angle of about 60 degrees. As shown in FIG. 6b, the total ion current generated by the gas supplied through a plurality of the capillary sources should be sufficient for compensating the negative spatial charge of the torch 629. The gas flow from the capillary tubes should maintain equilibrium conditions between generation of the optimal ion current, prevention of melting the bottom edges 630a of the capillary tubes, and prevention of extra cooling of the torch tips 621. Equilibrium can be achieved by controlling the argon flow with use of a mass flow meter 725 (FIG. 7c) and by approaching the ends of the capillary tubes to the plasma torch in the vicinity of the tip 629 of the torch 621. Shifting of the capillary tube edge 730a down toward the substrate 709 into the area designated by letter A will lead to cooling of the substrate surface of 706 instead of neutralizing the torch tip 629. As mentioned above, the distance A should range from 7 to 8 mm. Shifting the tip of the capillary tube beyond this range in the direction away from the torch will produce a defocusing effect because the ion injection and compensation will occur too far from the end of the tip 629.

The electron cloud 712 (FIG. 6b) paraxially moving in vicinity of the tip 629 of the torch 621 is used as an ionizer to generate positive ions 724 from the molecules of argon 728 ejected from capillary tubes into the cloud 712 in the amount sufficient to compensate for the electron charges. Under such conditions the tip 629 of the torch 621 that generates the electron cloud 712 ionizing the argon flow ejected from the capillary tubes is self-neutralized and can be squeezed to the state of a plasma needle 631 (FIG. 6a). This needle 631 (FIG. 6a), having cross-sectional dimensions commensurable with the diameter of the gas holes of the showerhead, delivers vapor and heat into these holes and applies a coating with high adhesion (see FIG. 3) to the inner walls of these holes. In other words, the focusing system 624 (FIG. 6a) of the present invention generates the needle torch 631 capable of penetrating into gas holes with a diameter as small as 0.5 mm and at the same time maintains a temperature sufficient to avoid quenching of the $Y_2O_3$ vapor which is to be delivered to the inner walls of the holes.

Figure 7A:
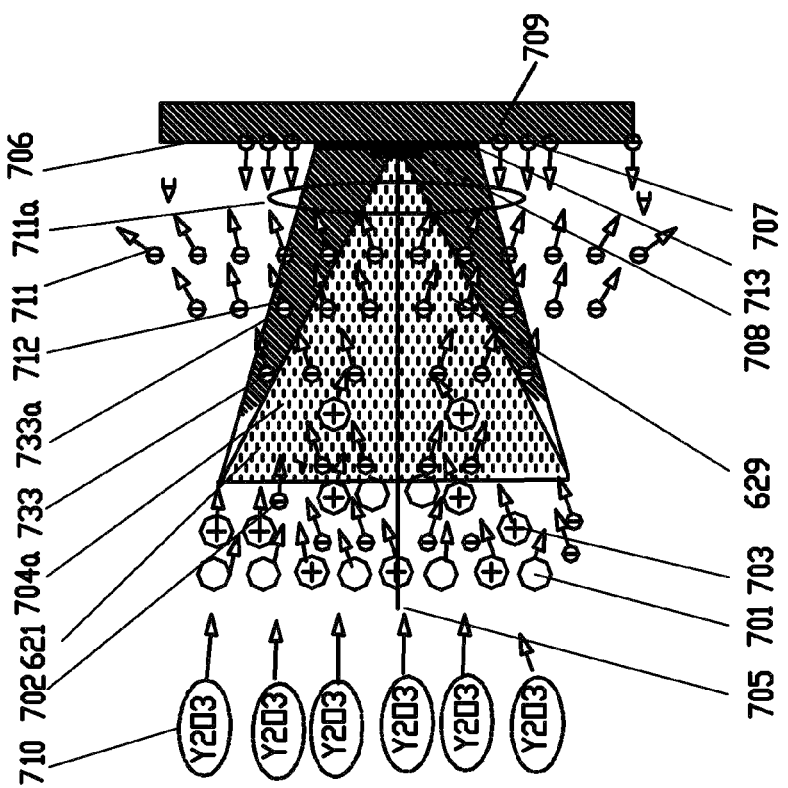
FIGS. 7a, 7b, and 7c illustrate the gas-focusing device in the torch system of the invention and the principle of operation.
Figure 7B:
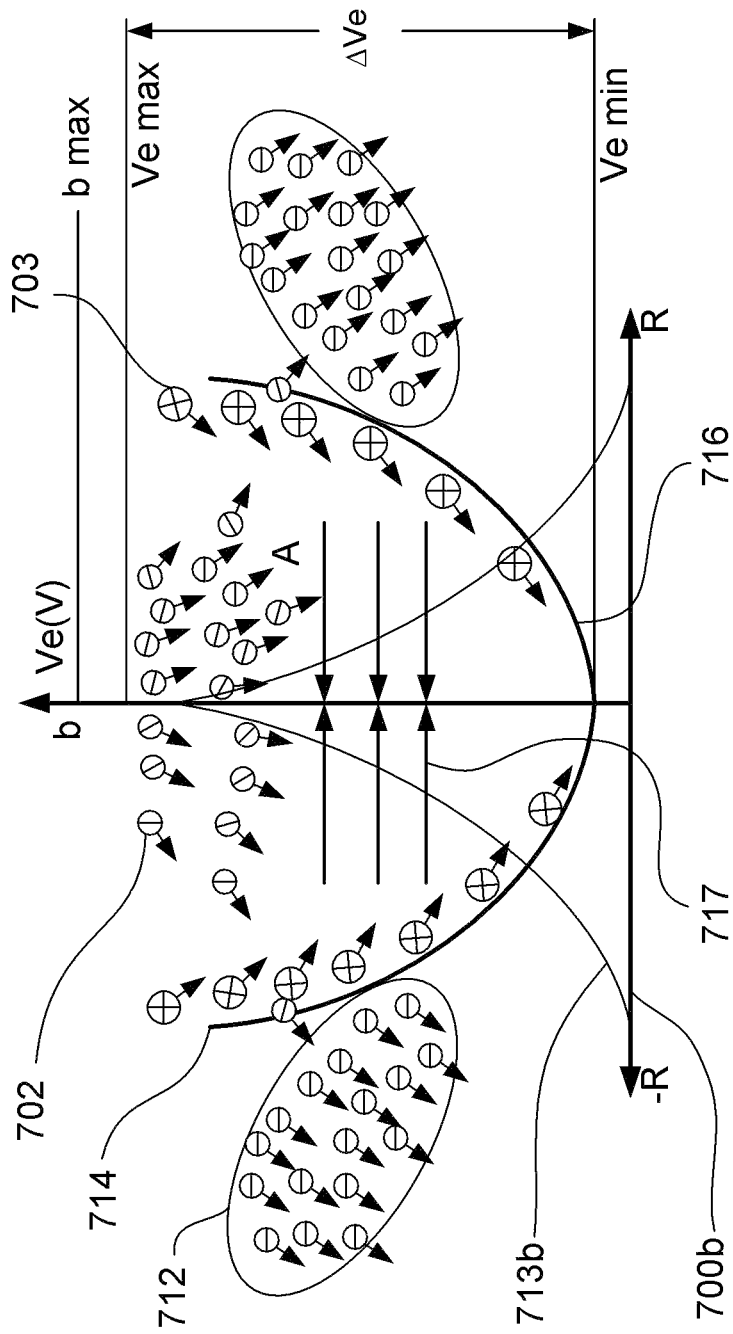
Figure 7C:
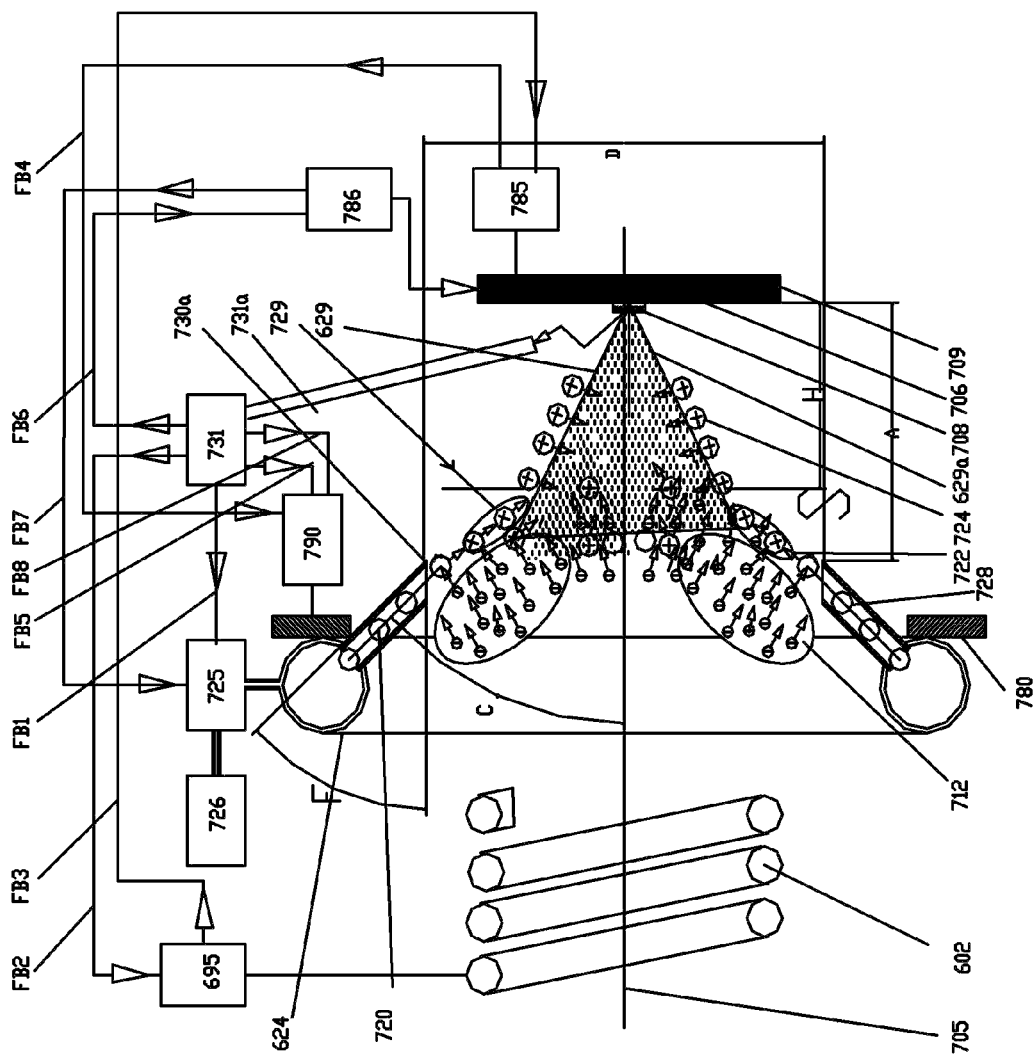

FIGS. 7a, 7b, and 7c illustrate a mechanism for gas focusing of the atmospheric torch 621 (FIGS. 5 and 6a) in more detail. The abovementioned atmospheric torch 621 is a high-temperature high-pressure flow of argon that contains neutral particles 701, excited molecules of argon, and a vapor 704a of vaporized nanoparticles 710. The atmospheric torch 621 also contains the charged species, including electrons 702 and ions 703 (in order to simplify the drawings, only one of the neutrals and one of each charged species are designated by respective reference numerals in FIG. 7a). As described above, the torch 621 is preliminarily pinched by the axial magnetic field generated by the RF inductor 602 (FIG. 6a), which also functions as an axial magnetic lens. The torch 621 is confined in its boundaries by the action of magnetic gas dynamic force developed in a highly ionized substance that moves with supersonic speed in the magnetic field. As a result, the plasma torch 621 acquires a tapered shape with a weakly sharpened tip 629 (FIG. 7a). Nevertheless, neither magnetic RF field nor magnetic hydrodynamic force developed in the above-described Tekna apparatus is sufficient for sharpening the tip 629 of the torch 621 to the required degree. In order to apply a coating onto the walls of the gas holes of the showerhead having a diameter of about 0.5 mm, the process requires use of a special fine focusing mechanism that generates a plasma torch with a tip having a diameter commensurable with the diameter of the gas holes to be treated. The design and operation of this focusing mechanism of the present invention is a unique feature of this torch system. To better understand the uniqueness of the present invention, let us once again clarify the difference between the focusing capabilities of the Tekna apparatus and the focusing mechanism of the present invention.

The focusing capability of the Tekna apparatus is limited by a rough confining of the torch in the vicinity of the axis of the plasma reactor. Therefore, the tip 629 of the torch 621 develops a deposition spot 708 on the surface 706 of the substrate 709 that originally has a relatively large size proximally of 5 to 6 mm in diameter, which is several times the size of a gas hole. Therefore, such deposition cannot provide coating in deep holes. The size of the tip 629 and the developed deposition spot 713 is even much larger. As mentioned, the electrons generated as a result of argon ionization in a high-temperature area overpopulate the negatively charged species that are contained in the torch. Because of these electrons, charges of the negatively charged species several times exceed the charges of the positive species. As a result, the torch 621 becomes negatively charged and broadened in the radial direction because of electron saturation of the torch.

In low-pressure plasma, the electron and ion charges are in equilibrium, but in high-pressure, high-density plasma, such equilibrium is absent. The radial electrical force of a negative spatial charge in each cross-section of the torch 621 and especially in the tip 629 pushes out the slow electrons to the boundary of the torch. Localized at the boundary they continue moving paraxially together with the torch as a shell surrounding the torch called an electron cloud 712. This electron cloud 712 causes a great amount of deterioration, such as charging the inner wall of the plasma reactor. A charge in the area of a high electrical field generated by the RF inductor (not shown in FIG. 7*a*) attracts from the torch 621 the ions that can bombard the inner wall of the plasma reactor (not shown) and can melt the inner wall. Although the downstream area from the plasma ball is free of an electrical field, the deposited electron charges attract dust that contaminates the walls. Charging of the surface 706 of the substrate 709 creates additional problems. Being deposited together with vapor on the surface 706 of the substrate 709, the negative surface charge 707 deteriorates the total process of deposition onto the showerhead.

As mentioned above, the electron cloud 712 increases the size of the tip 629 of the torch 621 and expands its initial boundaries 733 to new boundaries 733*a*. As a result, the cross-section of the tip 629 is enlarged. The vaporized nanoparticles 710, which initially were injected and confined in the vicinity of the axis 705 by the dynamic gas and electrical forces on the boundaries, will now lose any restriction in the radial direction and will be scattered on the surface 706. Although the first deterioration relates to the spatial charge in the tip 629, the second deterioration relates to the surface charge deposition 707 of the electrons from the electron cloud 712 on the surface 706 of the substrate 709. FIG. 7*a* shows deposition of the cloud electrons 702 that are carried by the tip 629 of the torch 621 in the direction of the axis 705. These electrons have the ability to be deposited on the surface 706 of the substrate 709 simultaneously with deposition of the vapor 704*a*. As a result, the surface 706 becomes negatively charged.

Figure 7D:
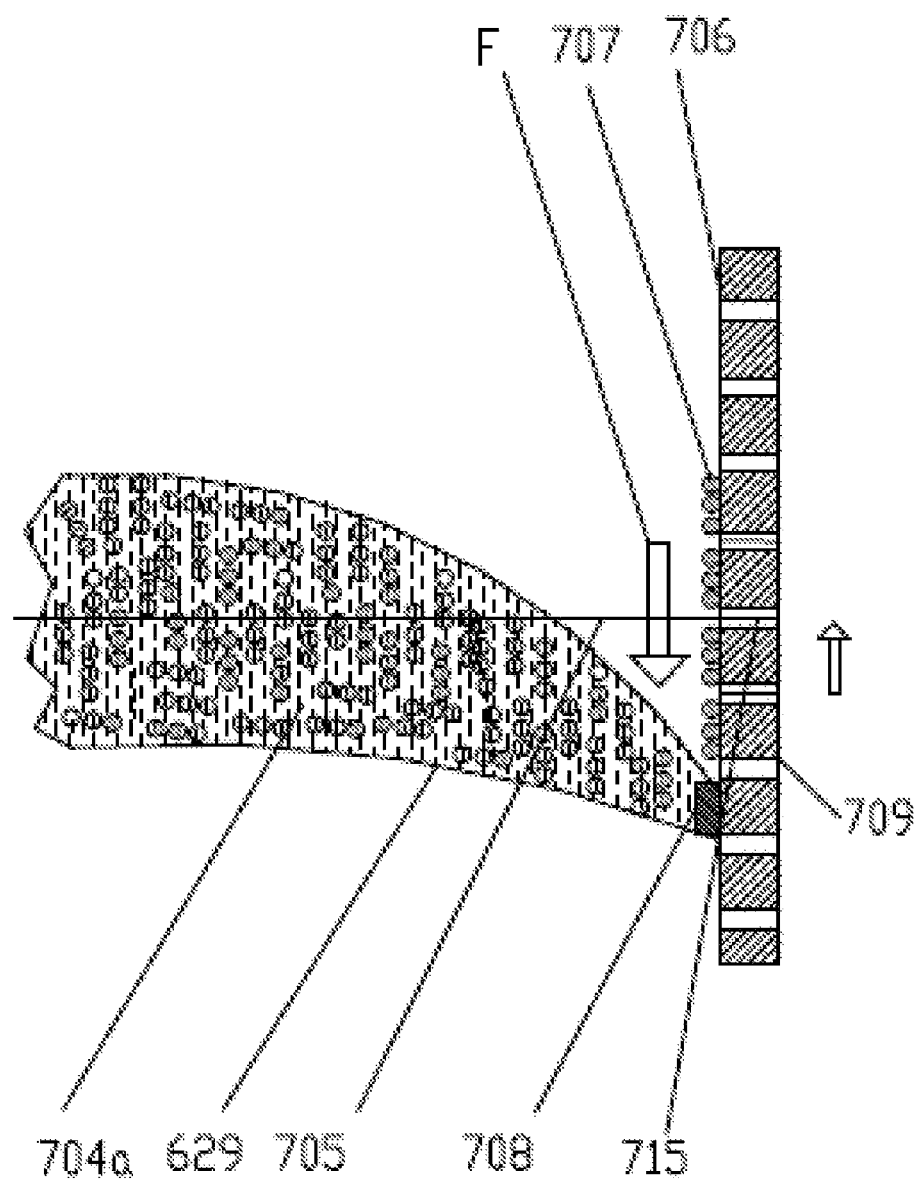
FIG. 7d is a scheme of drive mechanisms for movements of the plasma reactor together with the focusing device toward and away from the treated object and for movement of the object relative to the torch tip.

The above-described charging produces two negative effects. The first one is that a negatively charge layer 707 formed on the substrate 709 (FIG. 7*a*) repels a part of the new electrons 711 that come from the tip 629 when the latter approaches the surface 706 of the substrate 709. The repelled electrons 711 form a negative electron sheath 711*a* in vicinity of the surface 706 in front of the tip 629 of the torch 621. Therefore, the tip 629, which already has been broadened by the negative spatial charge of the torch, is further enlarged by the negative surface charge formed on the surface 707 during penetration of the sheath 711. Expending of the deposition zone develops a new deposition spot 713 that is several times larger than the size of the spot 708 that could be obtained if the tip 629 were neutral. The second deterioration effect is shown in FIG. 7*d* where the tip of the torch is aimed into the gas holes 715 of the substrate 709 and carries vapor 704*a*. The vapor-carrying tip 629 overwhelmed with the negative species 702 (FIG. 7*b*) deviates from its direction to the gas hole 715 aligned with axis 705 because of the negative surface charge 707 on the surface 706 of the substrate 709. This surface charge 707, which moves together with the substrate 709, creates an electrical force F that deflects the tip 629 from the direction to the holes 715. This force also causes the tip 629 to follow the substrate 706 motion but in the direction opposite the movement of the substrate because both the tip 629 and the surface 706 are charged negatively. Because the surface charge 707 pushes the tip 629 sidewise, the deposition spot 708 can be offset from the axis 705. When the tip 629 of the torch 621 and the gas hole 715 are not aligned, the torch tip 629 can deliver neither the vapor 704*a* for deposition of $Y_2O_3$ into the gas hole 715 nor the heat needed for stronger adhesion of the deposited nanolayer to the treated surface. If the inner walls of the gas holes are not coated with a protective layer, the showerhead will not be protected from degradation that may be caused by the parasitic hollow discharge developed inside the holes.

It is understood from the above that the negative spatial charge and the surface charge created by the electrons overwhelming the tip 629 of the atmospheric torch 621 are responsible for deterioration of the process of deposition of $Y_2O_3$ into the gas holes. However, in order to aim the torch exactly into the nozzles 138*a*', 138*b*', . . . 138*p*' and the gas holes 138*a*, 138*b* . . . 138*p* of the showerhead 120 (FIG. 2), the torch system of the invention should be provided with an appropriate torch focusing mechanism. The torch system of the invention is provided with such a mechanism that functions as a "gas lens" that focuses the tip 629 of the torch 621 by tuning the negative spatial charge and the electrical force developed by the aforementioned charges under atmospheric pressure.

Generally, focusing of high-current electron beams in a vacuum is carried out by gas focusing. The inert gas, which is injected into the vacuum chamber and ionized on the way of the electron beam, neutralizes the negative spatial charge. The negative spatial charge develops radial electric forces which push the electrons beyond the boundaries of the beam. Upon neutralization of the negative spatial charge, the aforementioned radial forces begin to attract the ions toward the axis of the electron beam. As a result, a total electron beam is pinched to the state of a filament.

The inventors herein find some analogy with prior use of an AP-ICP torch, especially with regard to compensation of the negative spatial charge. However, in distinction to such prior use, the inventors localize the neutralization effect in one cross section of the tip 629 of the torch 621 in a specific area of the tip 629 relative to the position of the substrate and at a specific time when the axis of the gas hole is aligned with axis of the torch. In the torch system of the present invention, an auxiliary inert gas is delivered to the target area exactly at a specified time and tangentially to the torch because if the focusing gas flow is injected into the torch at a normal angle thereto, the high pressure of the torch will repel the injected flow. The inventors found also that the deteriorating electron cloud can be used in a positive way as an ionizer of the gas flow directed to a specific point of the tip of the torch for compensation of the negative spatial charge. The mechanism of such focusing can be explained with reference to FIG. 7*b*, which shows the spatial distribution 713*b* in the radial direction R of electron density b=f(R) in a cross-section of the tip 629 close to the surface 706. In the plasma reactor, electron density is highest at the axis 705 and decreases in the radial direction from this axis (FIG. 7*a*). This distribution results from saturation of electrons 702 in a cross-section of the tip 629 of the torch 621 (FIG. 6*a*) and is similar to the Gaussian distribution of a negative volume charge in an electron beam in vacuum. Like the electron beam in a vacuum, the tip 629 of the atmospheric torch 621 overpopulated with electrons 702 has a negative spatial charge, with the highest density in the vicinity of its axis 705. According to Gauss' law, the distribution 713*b* (FIG. 7*b*) has maximum potential $V_{max}$ on the axis 705 and falls down exponentially with increase of radius R. Therefore, in each cross-section of the tip 629, a drop of potential in distribution of the negative volume charge can be presented as a virtual potential ditch 714 that is characterized by depth (DELTA Ve) that depends on a radial gradient of the potential on the axis 705 of the tip 629 and at its boundary 733*a* (FIG. 7*a*). The potential ditch 714 (FIG. 7*b*), which represents radial distribution of negative potential Ve (R) 715, is also characterized by a negative potential minimum $Ve_{min}$ 716 on the axis of the torch that depends on the negative axial volume charge. It is understandable that approaching the tapered tip 629 to the surface 706 of the substrate 709 causes increase in density of the negative spatial charge (FIG. 7a). This also causes increase in the depth (DELTA Ve) of the ditch toward the surface 706 of the substrate 709 (FIG. 7d). The gradient of potential inside the ditch 714 in the radial inward direction toward the axis 705 develops a lateral electrical force 717 that pushes the electrons 702 to the boundary 633a (FIG. 7a). The electrons expelled by the electrical force develop the electron cloud 712 (FIG. 7b). At the same time such force 717 pushes in and toward the axis 705, the positive ions 703 contained in the tip 629 are rolling down into the bottom of the potential ditch 714, as shown in FIG. 7b.

The ditch 714 could absorb the ions from outside and provide self-compensation if the tip were enriched by the ions. However, the shortage of ions in the tip 629 keeps this tip 629 uncompensated. As mentioned, the expelled electrons develop the electron cloud 712 outside the tip, thus spreading the boundary of the tip 629 (FIG. 7a). This electron cloud 712 moves coaxially to the torch flow and increases the outer diameter of the tip 629 of the torch 629 (FIG. 7A). Increase in axial electron density in the tip 629 causes increase in negative volume charge potential on the axis 705. The radial distribution of negative potential Ve (R) 715 with the spatial, virtual potential ditch developed along the longitudinal axis 705 is shown in FIG. 7B. Both the electron cloud 712 that spreads the tip 629 and the sheath 711a (FIG. 7a) located above the negatively charged surface 706 diffuse the torch tip 629 and thus drastically increase the deposition spot 708 on the surface 706 of the substrate 709. Moreover, as shown in FIG. 7d, the surface charge 707 deviates the tip 629 of the torch 621. Fortunately, the same negative potential ditch that provides an electrical force has ability to pull in the positively charged species 703. Therefore, the ditch 714 has some focusing properties absorbing the outside ions 703 in the direction of the axis 705 for self-equalization of torch plasma density. However, many more ions than the torch can produce and supply are requested for self-equalization and total compensation of the negative volume charge.

It is understandable that such subsidizing ions should be directed in just one place of the tip of the torch and their dose should be well controlled. If the flow of the ionized molecules of argon is injected normally to the torch, it can be rejected because of high pressure inside the tip 629 of the torch 621 (FIG. 7c). The inventors proposed to enrich the tip 629 with ions from additional ion sources positioned radially outward from the tip 629 and directed obliquely to the tip 629 of the torch 621. The inventors have found that a destructive effect of the electron cloud 712 (FIG. 7c) following the torch 621 that increases the size of the tip 629 of the torch 621 and enlarges the deposition spot 708 on the surface 706 of the substrate 709 can be converted into a positive effect for improving the same tip 629, particularly for ionizing molecules of the argon flow directed to the tip from outside sources. More specifically, the electron cloud 712 (FIG. 7c) in the vicinity of a boundary 733a (FIG. 7a) of the torch tip 629 can serve as an ionizer for a plurality of molecular flows 720 (FIG. 7c) injected in the direction of the tip 629 of the torch 621. The generated ions 722 inherit the same direction of the flows 720 maintained by the capillary tubes 728 ejecting the molecular flows precisely tangentially to the tip 629 of the torch 621.

The focusing system 624 (FIG. 7c) is a well-controlled multiray ion source directing ions to the axis of the tip 629 for injection of positive species from outside into the proper area of the tip 629. The system is designed to tune focusing of the tip 629 of the torch 621, reducing the depth of the potential ditch 714 (FIG. 7b) to some limit and thus reducing the negative spatial charge of the tip 629. More precisely, the focusing system controls the lateral electrical force 717 (FIG. 7b) generated by such ditch 714 in an ion-subsidizing window where shortage of the ions injected from outside causes focusing to be insufficient. On the other hand, focusing of the tip 629 also can fail if the amount of subsidizing ions exceeds a critical level. Such ion reinforcement of the ion population in the tip 629 is provided by tangentially injecting the ion flows 724 (FIG. 7c) that slide on the boundary 629a of the tip 629 to the specific area S (FIG. 7c) over a distance H from the surface 706 of the substrate 709. Being pushed in this specific area S into the tip 629 by the lateral electrical force 717 (FIG. 7b), these ion flows provide fine focusing of the tip 629 (crossover on the surface 706) and reduce the size of the deposition spot 708 needed for coating of the inner walls of the gas holes of the showerhead with a protective layer. Fine-tuning an amount of the generated ions 724 injected into the tip 629 is provided by well-controlled flows 722 of inert gases such as helium or argon, which have a low ionization potential. Another requirement for the fine focusing is to provide accurate positioning of the injection area S. The fine focusing of the tip 629 is provided by optimization of the distance A from the edges 730a of the capillary tubes to the surface 706 of the substrate 709, depending on the distance H where the ions from the capillary tubes are injected onto the tip 629.

As a result, an ion shower 729 (FIG. 7c) that envelops the tip 629 can be formed from the flow 722 of inert gases such as helium and argon, which have a low ionization potential. Penetration of these flows 722 of the electron cloud 712 leads to ionization of molecules 728 of these flows 722 and to subsequent enrichment of the tip 629 of torch 621 with newborn ions 724 of the ion population 703 (FIG. 7b). As shown in FIG. 7b, the torch ions 703 roll down into the potential ditch 714 under the effect of the lateral electrical force 717. A contribution of only these ions into the positive spatial charge is not sufficient. However, a weak population of the positively charged species 703 inside the torch is supplemented by additional ions 724 that roll into the potential ditch 714 (FIG. 7b) together with the ions 703. The potential ditch 714 pulls these ions in due to the same electrostatic force 717 that previously pushed the electrons out. This action compensates for the negative spatial potential and lowers the depth of the potential ditch 714. If in result of such supplement the ion population in the tip 629 reaches the critical level known as overcompensation, the electrostatic force 717 will be weakened, and without any restraint by the force 717, the tip 629 will be diffused. Therefore, a dose of the subsidized ions 724 should be limited to receive a sharp shape of the tip 629 and fine focusing on the surface 706 of the substrate 709. Such an effect of focusing the charged plasma torch tip 629 is called "gas focusing." This focusing requires very fine tuning and can be achieved by controlling the geometry and positions of the capillary tubes relative to the tip 629 of the torch 621 and the flow rate of the inert gas flows 722 that are ejected from the capillary tubes 626-1, 626-2, . . . 626-n (FIG. 6).

The argon flows 722 needed for the following ionization and compensation are provided by positioning the capillary tubes 626-1, 626-2, . . . 626-n in a specific area S outside but close to the charged tip 629. Additional ions 724 supplied from outside can partially compensate for the negative spatial charge in a specific cross sectional area of the torch and lower the level of the negative potential ditch 714 (FIG. 7b).

Figure 7E:
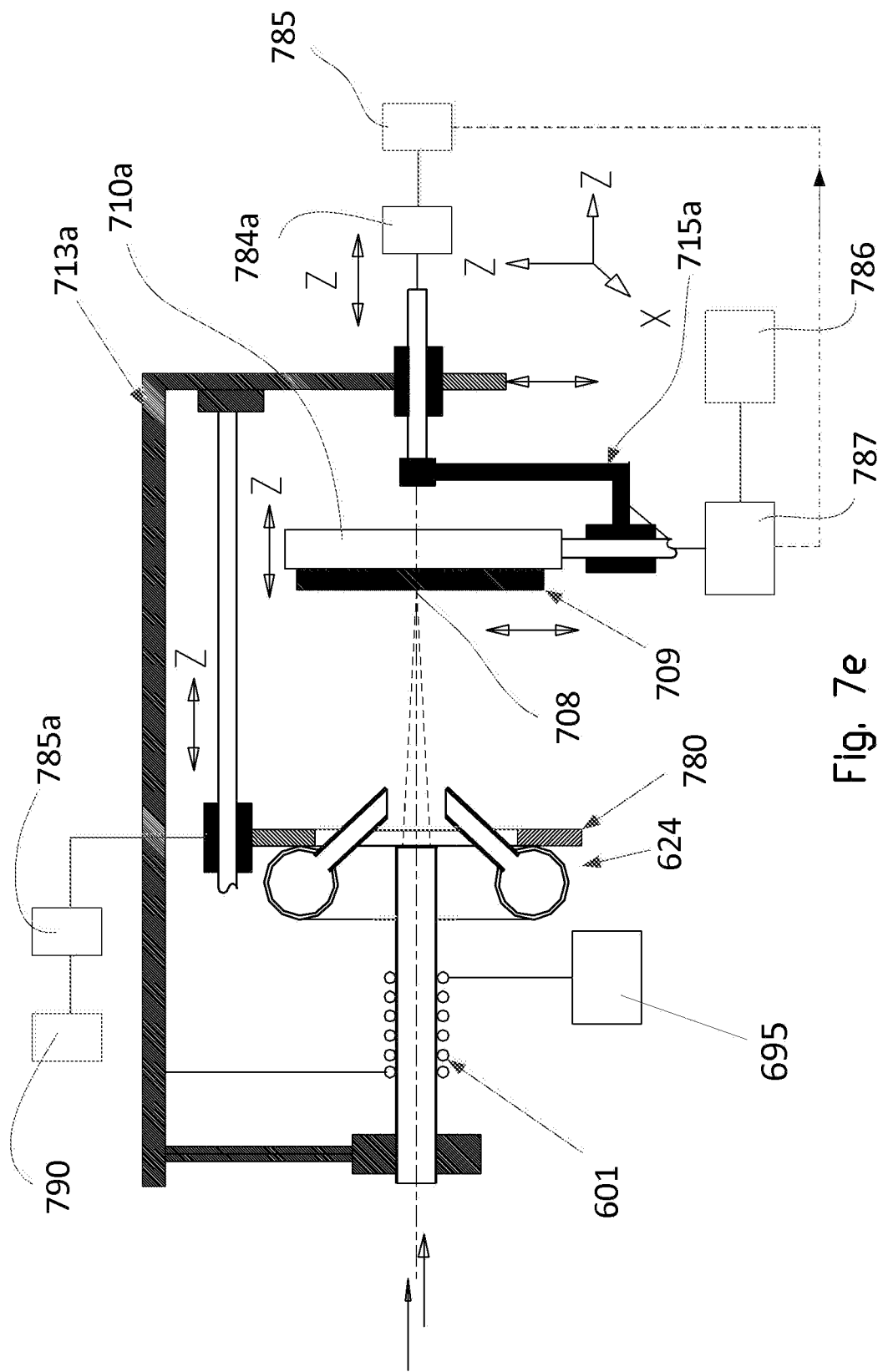
FIG. 7e is a schematic presentation of moving parts of the system of the invention.

FIG. 7e is a schematic of the moving parts of the system of the invention. All moving and stationary parts are held by a rigid frame 713a. One moving part is the focusing device 624 which moves in the direction of z-axis by a driver 785a under commands of the controller 790, and another moving part is a fixture 715a that supports an object holder 710a that holds an object, in this case the showerhead 709, and can move in the direction of axes x, y, and z. Movement of the fixture 715a together with the holder 710a and the showerhead 709 in the z-axis direction is performed by a driver 785b under commands of a controller 785. Movement of the fixture 715a together with the holder 710a and the showerhead 709 in the y-axis and x-axis directions are performed by respective drivers, only one of which, i.e., the y-direction driver 787 is shown in FIG. 7e, since movement in the x-axis direction is performed in the direction perpendicular to the plane of the drawing.

In the system of the invention, the plasma reactor is a stationary part relative to which the focusing device 624 and the showerhead 709, hence the parts that support these devices, are moved by their drivers under commands of their respective controllers.

The driver 712a and 714a for linear movements of the fixture 715a that holds the substrate holder 710a with the showerhead 709 along axes x, y, and z may comprise, e.g., a Kensington XYZ Theta Stage driven by a Model 4000 multiaxis controller with 0.1-micron resolution, 0.2-micron repeatability, and 1-micron total measurement error over the entire range of travel. Such precise repeatability allows multiple expositions of the same gas hole of the showerhead for deposition without melting of the hole by the high-temperature tip 629 of the torch 621.

The focusing device 624 maintained on the platform 780 can be driven, e.g., with the use of a Newport 462-XZ-M ULTRAlign Integrated Crossed-Roller Bearing Linear Stage driven by the Applied Motion controller Si 5835 with 0.1-mm resolution, which is sufficient for precise adjustment of the distance A between edges of the capillary tubes of the focusing system 624 and the surface 706 of the substrate 709.

The gas focusing system is just a single focusing means for the total torch generation system responsible for minimization of the deposition spot 708. Minimizing the deposition spot 708 is provided by tuning the gas flow through the mass flow controller 725, which supplies the focusing system 624 with argon. The minimal spot 708 is characterized by a high brightness of irradiation of spectrum of argon in a cross-section of the tip 629 of the torch in the vicinity of the surface 706 of the substrate 709. Therefore, the mass flow controller 725 has a feedback FB1 with a spectral optical system 731 that is provided for controlling the brightness of the argon spectrum and for spectral analysis of the content of the torch. The maximal brightness of the tip 629 of the torch and a small dimension of the spot on the surface of the substrate can be achieved with an optimal argon flow provided by the mass flow controller 725. In other words, the size of the deposition spot is determined as a function of the brightness of the argon spectrum determined by the spectral optical system 731.

An example of a spectral optical system 731 is the Ocean Optics Chem USB4 UV/Visible Spectrophotometer WU-83500-00, a product of Cole-Palmer, Ill., USA can be used for this purpose. This instrument detects irradiation from the tip 629 of the torch 621 and is tuned for the spectrum of yttrium as well as silicon oxide and silicon.

Thus, the gas mass flow controller 725 through which the focusing gas is supplied to the focusing device and a spectral optical system 731 for controlling the optimal abundance of spectrum of the coating material in the plasma torch, brightness of the torch spectrum, and for spectral analysis of the content of the plasma torch form a system for monitoring plasma torch characteristics.

The shape of the tip 629 of the torch 621 depends on the RF power applied to the RF inductor 602. However, under some circumstances the RF power should be changed. For example, a higher rate of deposition requires a high feeding rate of the precursor. Therefore, more RF power is needed to afford vaporization of the dense flow of nanoparticles in flight. Higher RF power also is needed if a commercial nanopowder contains particles of a larger size. Further increase in RF power is needed for handling nanoparticles made from a material of high enthalpy. Vaporizing of nanoparticles in flight is controlled by the spectral optical system 731 (FIG. 7c) with a fiberoptics 731a directed to the tip 629 of the torch 621.

When RF power cannot afford vaporization, no spectrum of yttrium will be received by the spectral optical system 731 in irradiation from the tip 629. Therefore, the spectral system 731 is supplied with the feedback FB2 (FIG. 7c) connected with the RF power supply 695 (a matching network connecting the RF power supply 695 to the inductor 602 is not shown in FIG. 7c). When the RF power increases to the level that affords vaporization of the nanoparticles, the spectrum of $Y_2O_3$ registered by the spectral optical system 731 is restored.

However, increase of the RF power applied to the RF inductor 602 (FIG. 6a, FIG. 7c) lengthens the tip 629 of the torch 621 and increases electron density in the electron cloud 712. Therefore, the position of the tip 629 of the torch 621 is shifted down in the axial direction toward the surface 706 of the substrate 709 (FIG. 7c). Such stretching of the tip 629 toward the substrate 709 increases the deposition spot 708. Because the fixture (not shown) that holds the substrate 709 is supplied with the z-motion mechanism that comprises a driver 784a with a controller 785 (FIG. 7c and FIG. 7e), after increase of the RF power the substrate 709 can be moved down to an amount needed to maintain the spot 708a in a small area. This shift is provided due to the provision of the feedback FB3 that connects the RF power supply 695 with the controller 785 of the z-motion mechanism of the fixture with the object holder. The z-direction is shown in FIG. 7c. Moving down of the substrate 709 increases the distance A between edges 730a of the capillary tubes and the surface 706 of the substrate 709. In order to restore focusing of the tip 629 of the torch 621 on the surface 706 of the substrate 709, the gas focusing system 624 (FIG. 7c) is supported by a platform 780, which is equipped with a Z-motion mechanism 603a that consists of a driver 784 and a controller 790 (FIG. 7e). The feedback FB4 connects the spectral optical system 731 with the controller 785 for coarse adjustment of a distance from the tip of the plasma torch to the surface of the object according to the optimal abundance of spectrum of coating material detected by the spectral optical system. Thus, the controller 790 of the motion mechanism of the platform 780 of the focusing system 624 and the controller 785 of the z-motion of the fixture are responsible for maintaining the distance A at an optimal value when the RF power changes. It should be understood that the controller 785 controls movements of three drivers that are responsible for movements of the holder with the substrate in the directions of axes x, y, and z. Only two of such drivers, i.e., the z-direction driver 786 and the y-direction driver 787, are shown in FIG. 7e. The x-direction driver, which moves the holder with the substrate in the x-direction, is not shown.

Referring further to the operation of the spectral optical system 731, it should be noted that if irradiation measured by the spectral optical system 731 through the fiberoptics cable 731 contains a spectrum of yttrium with a targeted abundance, it means that the RF power is sufficient for vaporization of nanoparticles, and deposition of $Y_2O_3$ can be provided without formation of clusters.

The spectral optical system 731 is the main controller for focusing of the tip 629 and for maintaining quality of the $Y_2O_3$ deposition at a required level. This system is provided with several forms of feedback to keep an abundance of the spectrum of yttrium on the same level. The fiberoptics cable 731a with a window is positioned near the surface 706 of the substrate 709 and is aimed at the deposition spot 708 where the vapor density and abundance of spectrum of yttrium are at their maxima. Due to the feedback FB5 that connects the controller 785<which controls movement of the substrate 709 in the Z-direction (FIG. 7c), with the spectral optical system 731, the substrate 709 can move up and down until the point of the tip 629 reaches the optimal focusing point on the surface 706 and the spot 708 acquires a minimal size. Coarse tuning is provided through the feedback FB4 that connects the controller 785 and the controller 790, while fine-tuning is provided by the feedback FB5 that connects the controller 790 with the spectral optical system 731.

Another duty of the optical system 731c is to prevent melting and vaporization of the material of the substrate 709 during deposition. If the spectrum of silicon appears in irradiation, this dictates decrease of the exposure time for the treated area of the substrate surface 706, while the feedback FB6 that connects the spectral optical system 731c to the controller 785 of the X-Y scanning motion system provides increase in motion speed of the substrate 709 in X and Y directions to prevent melting. As a result, the exposition time of the gas hole for deposition of the $Y_2O_3$ is reduced. Although total deposition on the inner wall of the gas holes cannot be provided during the short time of exposition and several approaches of the same gas hole are needed after deposition onto other holes (the showerhead has more than 2,000 gas holes), a longer cooling period prevents high-temperature destruction of the gas hole.

The controller 785 of the X,Y scanning system of the fixture (not shown) of the substrate 709, itself, is responsible for consumption of argon and is provided with the feedback FB7 which is connected with the mass flow controller 725 to increase the argon flow when the gas hole is aligned with the tip 621 and to decrease the argon flow during motion of the continuous surface when focusing of the tip 629 is not needed.

Thus, the feedback FB7 makes the process of deposition with such torch system cost effective. When the RF power increases or decreases, the substrate 709 is moved up or down. Such movements are associated with lengthening of the tip 629 and the necessity to keep the critical distance A between the ends of the capillary tubes 730a and the surface 709 constant. Two feedbacks, i.e., the feedback FB3 that connects the controller 785 of the z-motion mechanism of the fixture to the RF generator 695 and the feedback FB4 that connects the same controller to the controller 790 of the motion mechanism of the platform 780 that supports the focusing system 624 are responsible for coarse adjustment of the distance A. A precise tuning of the distance A is provided only by the spectral optic system 731. If the area of injection S (FIG. 7c) occurs above the optimal zone needed for compensation of the negative spatial charge of the tip 629 of the torch 621, focusing of the tip 629 will be violated. It also causes a close approach of the capillary tubes to the tip 629 of the torch 621. Although the end of each capillary has an oblique cutoff that allows closer approach to the tip 629 in order to reduce passage of ions 722 to this tip 629 of the torch 621 (large passage leads to recombination of the ions), one can expect that sometimes the edges 730a of capillary tubes may have a tight contact with a high-temperature area of the tip 629. In this case, the edges 730a of the capillary tubes (FIG. 6c) can melt. Therefore, it is necessary to avoid positions where the ends 730 of the capillary tubes 626-1, 626-2, and 626-n are overheated since if the quartz edges were to melt and evaporate $SiO_2$, the coating layer of Y203 would be contaminated with $SiO_2$. Using such contaminated showerhead in the plasma etching process will jeopardize plasma etching because the highly corrosive process gas will remove $SiO_2$ from the nanocoating, and this coating will become porous. Pinholes developed after removing $SiO_2$ from the coating, in turn, may lead to exfoliation and arcing. Therefore, the controller 790 of the Z-motion of the platform 780 of the focusing system 624 is also connected to the spectral optical system 731 through feedback FB8.

In order to prevent melting of the ends 730 of the capillary tubes 626-1, 626-2, and 626-n, the spectral optical system 731 is tuned for the spectrum of silicon oxide. If the spectrum shows irradiation of $SiO_2$ from the tip 629, the controller 790 of the Z-motion of the platform 780 of the focusing system 624 will receive an appropriate signal through the feedback FB8, and the drive unit of the focusing system 624 will move it down to the narrow part of the tip 629, increasing the gap between the edges 730a and the tip 629 until the spectrum of $SiO_2$ disappears.

Thus, it can be summarized that the spectral optical system 731 incorporates the following functions.

(1) Adjusting the RF power through feedback FB1 when the abundance of the yttrium spectrum becomes low. Such abundance can be restored after simultaneously changing positions of the substrate 709 and the focusing system 624 through the feedbacks FB2 and FB3, correspondingly.

(2) Focusing the tip 629 of the torch 621 on the surface 706 of the substrate 709 to the maximal brightness of the spot 708 registered by the spectral system 731 as the maximal abundance of the spectrum of argon. Due to the feedback FB5 that connects the controller 785 which controls movements of the substrate 709 in the Z-direction, the substrate 709 moves up and down to reach the optimal focusing point of the tip 629 on the surface 706 and the minimal size of the spot 708.

(3) Preventing the melting of the ends 730 of the capillary tubes 626-1, 626-2, and 626-n of the focusing system 624. The spectral optical system 731 can register the spectrum of $SiO_2$ and move the focusing system 624 down, shifting the ends of the capillary tubes from a high-temperature area under control of a signal from the feedback F8 that connects the controller 790 of the Z-motion of the platform 780 of the focusing system 624 with the spectral optical system 731.

The spectral optical system 731 can register the spectrum of Si and move the fixture away from the substrate to limit the time of exposition of a gas hole to the high-temperature tip 629 of the torch 621 under command of the feedback F6 that connects the controller 785 of the X,Y motion of the substrate 709 (FIG. 7c and FIG. 7e).

In other words, due to the aforementioned feedback and due to the ability of registering the spectra of argon, yttrium, silicon, and silicon oxide, the spectral optical system 731 provides a quick response to any instability that may occur during deposition. In all situations the spectrum of yttrium should be restored to optimal abundance, and the presence of silicon and silicon oxide must be eliminated.

During operation of the torch system of the invention, the functions and operations of the above-described feedback can be summarized as follows. When during monitoring the spectral optical system 731 detects that the level of yttrium in the spectrum is too low, the spectral optical system 731 will request through the feedback FB2 that the RF power supply 695 increase the RF power. If this causes lengthening of the torch 621, a command is sent back to the RF power supply 695 to reduce the RF power. At the same time, a command is sent to the controller 785 to move the object holder 710a with the object 709 so that the tip of the torch remains in the same position with respect to the surface of the object 709.

If during coarse adjustment of the position of the object, the spectral optical system 731 detects an abundance of yttrium in the spectrum and a torch that has lost brightness from the spot on the object surface, then through the feedback FB4 a signal is sent from the spectral optical system 731 to the controller 790 that controls the driver 785a to move the focusing system 624 toward the object.

Fine focusing is also carried out through the link of the spectral optical system 731 with the controller 790 but by means of the feedback FB5.

If the object, e.g., the substrate 709, melts and silicon appears in the spectrum, then the multichannel controller 786 sends commands to the respective drivers that move the object holder 710 with the object 709 along axes X and Y (only one of these drivers, i.e., the driver 787, e.g., for movement along axis x, is shown in FIG. 7e) to change the speed of movement of the object holder 710 in order to ensure the most optimal exposition of the object 709 to the tip 629 of the torch. This is done through the feedback FB6.

The multichannel controller 786 has an additional function, i.e., to send a signal through the feedback FB7 to the mass flow controller 725 to shut down the supply of the focusing gas when the torch is not aligned with the position of the hole to be treated. This is necessary for preventing useless waste of the expansive gas, in this case argon.

Finally, if the focusing system is in a position at which the ends of the capillaries touch the torch, this will cause melting of the capillary material, e.g., silicon. This action will be immediately detected by the spectral optical system 731, and the latter will send a command to the controller 790 to move the focusing system down along the conical surface of the torch to a position at which the optimal radial gap is formed between the ends of the capillaries and the surface of the torch. This is done through the feedback FB8.

The ion current from the capillary tubes 626-1, 626-2, and 626-n should be well controlled to provide focusing of the tip 629 of the torch 621. Such control is provided by using the mass flow controller 725, which communicates with an argon bottle 726 (FIG. 7c). This can control the argon pressure inside the hollow doughnut-shaped manifold 624 which surrounds the tip 629 and to which the capillary tubes 626-1, 626-2, . . . 626-n are attached.

Specific functions of the mass flow controller 725, which is another indispensible instrument of the torch system of the invention, are the following:

(1) Generates the ion flow from the capillary tubes 626-1, 626-2, and 626-n of the focusing system 624 for focusing the tip 629 of the torch 621 on the surface 706 of the substrate 709 to maximal brightness of the spot 708. The brightness is registered by the spectral system 731 as maximal abundance of the spectrum of argon. Therefore, the fine focusing and the minimal size of the spot of the tip 629 on the surface 706 of the substrate 709 is provided due to the provision of the feedback FB1 that connects the mass flow controller 725 to the spectral system 731.

(2) Saves argon as a working gas by reducing gas flow when the gas hole of the showerhead is not exposed to the tip 629 of the torch 621. As mentioned above, for application of the coating onto a continuous surface of the showerhead, focusing of the tip 629 is not needed. Due to the feedback FB7 that connects the mass flow controller 725 with the controller 785 of the X, Y scanning mechanism of the fixture that holds the substrate 709, the maximal feeding of the capillary tubes 626-1, 626-2, and 626-n with argon is provided just after alignment of each gas hole of the showerhead with the axis 705 of the tip 629 of the torch 621. As soon as the drive mechanism for moving the substrate 709, in this case the showerhead, in X, Y directions shifts the gas hole of the showerhead away from axis 705 of the tip 629 of the torch 621, the argon fed to the focusing system 624 is minimized. The capillary tubes 626-1, 626-2, . . . 626-n should be cooled in order to prevent melting not only of the holes but also of the flat surface of the showerhead when the latter surface is exposed to the heat generated by the tip 629 of the torch 621.

Gas focusing should be controlled with the use of a special spectral optical system 731 that can detect the spectrum of $Y_2O_3$ under normal operation and under melting conditions of the capillary, as well as detect the presence of Si in the spectrum if the substrate moves too slowly.

The above-described feedback provides the saving of an expensive working gas, in this case argon, which is supplied in minimal amounts when the showerhead that moves relative to the tip 629 of the torch 621 is exposed to the tip 629 with its flat surface, and which is supplied at a maximal amount when the nozzles and the gas holes of the showerhead are aligned with the tip 629. The mass flow controller may comprise a Brooks Instrument GF81 High-Flow MFS that can be used for gas flow rates up to 300 slpm, making it ideal for high-flow applications, especially for the aforementioned capillary focusing system 624 with high gas consumption.

Operation of the torch system 600 of the present invention (FIGS. 5 and 6a) for precisely coating the inner walls of the narrow holes, such as gas holes of the showerheads, especially of the shower heads of Applied Materials, LAM Research, and Tokyo Electronics Limited showerheads, will now be described with reference to FIGS. 6b, 7b, and 7c.

The torch system 600 operates in the atmosphere and does not need a vacuum system or enclosure, which is important for treating large-area showerheads.

After generation of the torch 621, the drive mechanism aligns the gas hole of the showerhead 709, which is to be treated, with the axis 705 (FIG. 7c) of the torch 621, thus exposing the hole to the tip 629. Through the feedback FB7, the controller 785 increases the flow of argon from the mass flow controller 725 to the focusing system 624. The fine gas flow control of the mass flow controller 725 is connected with the spectral optical system 731 through the feedback FB1.

Therefore, the next step of operation is focusing the tip 629 of the torch 621 on the surface 706 of the substrate 709, which includes the gas flow control through feedback FB1, and positioning the focusing system 624 through the feedbacks FB5 and FB8.

As mentioned above, a negative volume charge inside the tip 629 of the torch 621 pushes out all negative species from the axis of the torch developing the electron cloud 712 that causes expansion of the tip 629 to the extent that the tip cannot deliver vapor of $Y_2O_3$ into the gas hole of the showerhead. This cloud 712 also charges the surface 706 of the substrate 709. Thus, the focusing system 624 should generate the positive ions 724 in an amount sufficient to compensate for the action created by the defocusing forces to cause the negative volume charge inside the tip 629 of the torch 621. The capillary tubes 626-1, 626-2, etc., should be located close to the electron cloud 712, and their edges 730a should be almost immersed into the electron cloud. The ion current ejected from the capillary tubes 626-1, 626-2, . . . 626-n under such conditions provides fine focusing of the tip of the torch for penetration into the gas holes of the showerhead. Current is generated from the gas flow controlled by the mass flow controller 725.

Molecules 728 of argon (FIGS. 6*b*, 7*c*) ejected at a low speed from the capillary tubes 623-1, 623-2, etc., through the electron cloud 712 are bombarded by the electrons of the cloud 712 that move in the vicinity of the highly negatively charged torch tip 629. An area highly populated with electrons area 718 between exits 730 of the capillary tubes and the boundary of the torch tip 629 is the area where the ions 724 are generated (FIG. 6*b*) from molecules 728 after leaving the exits 730 of the capillary tubes 623-1, 623-2, etc. Presumably, this area borders the bottom edges 630*a* of the capillary tubes 623-1, 623-2, etc., with a gap controlled by the axial position of the focusing system. This gap prevents overheating of the capillary tubes and charging them by electrons. On the other hand, an increase in this gap leads to the fall of ion current because of the recombination of ions that have low free passage in the atmosphere. Efficiency and lifetime of the focusing system depend on its geometry, the position relative to the cross-section of the tip where the ions should be injected, and the distance A to the surface of the substrate. Positions of the bottom edges of the capillary tubes are characterized by diameter D (FIG. 7*c*) that exceeds the diameter d of the cross-section of the tip in the place where the ions are injected, and the space between these diameters is occupied by the electron cloud at the area of high temperature that exceeds the melting point of quartz. The bottom edges 730*a* of the capillary tubes should not enter this area because of the risk of melting these edges and vaporization of $SiO_2$, which will be immediately registered by the spectral optical system. Position of the area 729 is determined by specific axial distance A from the bottom edges 730*a* of the capillary tubes to the surface 706 of the substrate 709 and the radial distance D/2 from the axis 705 of the torch 621 to the bottom edges 730*a*. (The aforementioned diameter D is the diameter of the imaginary circumference where the bottom edges are located.) The radial distance D/2 is fixed, but the axial distance A can be adjusted using the motion of the platform 780 of the focusing system 624 to find the optimal gap between the edges 730*a* and the boundary of the tip 629 of the torch 621. This gap can provide generation of positive ions 724 from the flows 722 of argon ejected from the capillary tubes 626-1, 626-2, ... 626-*n* into the electron cloud 712 that moves in the vicinity of the narrowest part of the torch tip 629. Values of the aforementioned distances are to be chosen experimentally, measuring abundances of spectra of yttrium and $SiO_2$ in irradiation registered by the spectral optical system 731 through the fiberoptics 731*a*.

Distance A should be from 8 to 10 mm and can deviate to provide the best performance for focusing of the tip of the torch. Distance D/2 depends on the number of capillary tubes and their outside diameters and should range from 5 mm to 6 mm from the axis of the tip 629. These distances are supposed to be short enough to provide efficient generation of ions 724 and a free path of the ions to the tip 629 in order to neutralize most of the negative electron volume charge. If these distances are not sufficiently short, the volume charge will lose its focusing properties.

At the same time, the aforementioned distances will keep the argon flows 722 (argon as a focusing gas) from all capillary tubes 626-1, 626-2, ... 626-*n* far enough from the tip 629 of the torch 621 and the surface 706 of the substrate 709 to prevent cooling of the tip 629 as well as of the surface 706. Gas focusing without cooling of the tip 629 can be provided by preheating the argon flow 722 from the capillary tubes. Thus, the heat irradiated by the tip 629 can simultaneously heat the exits 730 of the capillary tubes 626-1, 626-2, ... 626-*n* and the argon flows 722 ejected from these capillary tubes. Therefore, the heated capillary tubes must deliver the ejected argon flow 722 at a high enough temperature to prevent cooling of the torch tip 629. In order to prevent melting of the exits 730 of the capillary tubes 626-1, 626-2, ... 626*n*, approaching of the capillary tubes to the boundaries of the tip 629 of the torch 621 should be limited by a predetermined distance which depends on the oblique angle C of injection of the ion flows 729. In other words, some dependence exists between the distances from the capillary tubes to the surface 706 of the substrate 709 (showerhead) and an oblique angle C of the capillary direction to the longitudinal axis of the torch 621. A cutoff angle of the ends of the capillary tubes (FIG. 7*c*) helps to provide a tight approach without melting in order to increase the ion current.

Generation of the ions 724 and the ion current should be sufficient to compensate for a negative volume charge of the tip 629 of the torch 621 and to reduce the size of the deposition spot 706*a*. The spectral optical system 731 controls focusing until the minimal size of the torch spot on the substrate is reached. This is achieved by registering the brightness of the spot and the maximal abundance of the spectrum of argon (feedback FB1). This system also registers the spectrum of silicon and controls the time of deposition of a coating into each individual hole (feedback FB6). Therefore, destruction of the hole by melting is prevented. The aforementioned mass flow meter 725, which is controlled by the spectral system 731 through the feedbacks FB2 and FB8 for monitoring $SiO_2$ spectra, keeps the gas flow 722 in a range low enough to prevent cooling of the tip 629 and at the same time high enough to prevent melting of the exit ends 730 of the quartz capillary tubes 626-1, 626-2, 626-*n* using the controller 790 for positioning of the focusing system 624.

The next step is a deposition process that is accompanied by control of vaporization of the $Y_2O_3$ nanopowder. During deposition, the spectral optical system 731 monitors the abundance of the yttrium spectrum and either increases RF power through the feedback FB2 or stops the deposition process if the size of nanoparticles is too large to the extent that vaporization cannot be afforded by the RF generator. Because the geometry of the torch changes, other feedback, i.e., FB3, FB4, also participate in controlling the deposition spot.

Thus, according to one aspect of the invention, the torch system of the invention works as a gas focusing lens provided with a tuner such as the mass flow controller 725. Such tuning depends on the RF power applied to the RF inductor 602. If the RF power sustaining the torch 621 is increased, the gas flow 722 controlled by the mass flow controller 725 should also be increased to compensate for the increased negative volume charge. The position of the focusing system 624 should be adjusted also in the axial direction for injection of ions into a specific area of the tip 629. The generated ion current should not exceed the threshold to avoid overcompensation and smoothening of the ditch 714 (FIG. 5*b*) because its focusing properties may be deteriorated and the torch may become unstable. It is understandable that the ion generation area 729 is critical for this torch system and depends on many factors, including gas velocity and energy of the torch electrons that, in turn, depend on temperature of the torch in this area. It was mentioned that approaching the capillary tubes 626-1, 626-2, ... 626-*n* closer to the torch tip 629 leads to melting of the capillary tubes, but moving these capillary tubes away increases the passage of the ions that can be recombined into neutrals. With reduced ion current, the gas focusing effect is reduced or eliminated. Because the capillary tubes are oriented obliquely at angle C to the torch axis, they supply the generated ions with vector velocity that allows them to move at a tangent closer to the axis, together with the torch species, and provides inflight neutralization and sharpening of the tip 629 of the torch. Other orientations of the capillary tubes can develop premature focusing and defocusing above the tip 629. Caution should also be observed with regard to cooling the surface of the substrate (showerhead). Approaching the ends of the capillary tubes to the substrate below some critical distance $A_{min}$ may cool the surface 706 and reduce heat delivery to this surface by the torch to keep this at a predetermined temperature of 240 to 300° C., which is needed to provide strong adhesion of the deposited nanolayer. The torch, itself, provides such preheating. By moving the substrate 709 by means of the drive mechanism 722 at a predetermined speed that provides a predetermined exposure time, overheating the material of the surface 706 of the substrate 709 can be prevented. The drive mechanism 722 may comprise any suitable mechanism for linear movement of an object. Such mechanism is well known in the art and is beyond the scope of the present invention. Thus, fine control of gas focusing leads to equilibrium between negative and positive volume charges, and when all aforementioned conditions are satisfied, the deposition spot 708 can be reduced to 1 mm so that the tip 629 of the torch 621 can be focused into the gas hole. As a result, it will be possible to apply a protective coating onto the inner walls of the gas holes from the entrance of the hole to a sufficient depth.

The optimal prevention of melting can be found experimentally by approaching the ends of the capillary tubes to the surface 706 of the substrate 709 (showerhead) or moving them away from the substrate (showerhead) and at the same time by determining the operation window for the mass flow controller 725 that controls the gas flow 722. It is understandable that the size of the deposition spot 708 depends on the sharpness of the tip 629. We already know that the size of the deposition spot 706a can be modulated by the gas flow 722 from all capillary tubes 626-1, 626-2, ... 626-n. For example, deposition of the gas hole with a diameter of 0.5 mm requires that the size of the deposition spot not to exceed 1 mm. For deposition onto the surface of the nozzle, the size of the deposition spot can be increased to 3 mm and more. A flat surface does not need focusing, and thus the feedback FB7 minimizes the flow of argon. It is important to know that a drop in temperature of the tip 629 below the lower threshold that keeps nanoparticles in a vapor state can lead to quenching of vapor and regeneration of nanoparticles in clusters and dust. The cooled torch will contaminate deposition.

Although the invention is shown and described with reference to specific embodiments, it is understood that these embodiments should not be construed as limiting the areas of application of the invention and that any changes and modifications are possible provided that these changes and modifications do not depart from the scope of the attached patent claims. For example, the focusing system can be machined from ceramic, with drilled holes in the ceramic body to replace the capillary tubes and improve accuracy in directing ion flow aimed at the tip 629 of the torch 621. The object treated with the system of the invention is not necessarily a showerhead but any other object that needs application of a coating onto the walls of small-diameter holes and recesses present on the flat surface of the object.

The invention claimed is:

1. A torch system for deposition of protective coatings onto the walls of holes and recesses present on a flat surface of an object, the system comprising:
a plasma reactor for generation of an atmospheric-pressure inductively coupled plasma torch having an axis and a high-temperature core surrounded by an electron cloud producing a spatial charge with a potential minimum on the axis of the plasma torch and ended by a torch tip with a crossover facing the object, the plasma torch tip having a conical shape;
an RF inductor that surrounds the plasma reactor and is connected to an RF power supply;
means at one end of the plasma reactor for supplying a gaseous medium to sustain the plasma torch and a precursor for the formation of a protective coating;
a plasma torch focusing device positioned at the end opposite to said one end of the plasma reactor;
an object holder that supports the object and is moveable relative to the plasma reactor and the focusing device;
a first driver for moving the focusing device coaxially to the direction of the plasma torch;
a first controller that is connected to the first driver and controls operation thereof;
a second driver and a third driver for moving the object holder with the object in mutually perpendicular directions, respectively, in a plane perpendicular to the axis of the torch;
a second multichannel controller connected to the second driver and a third driver for controlling their operation;
a fourth driver for moving the object holder with the object in the direction of the axis of the torch; and
a third controller that is connected to the fourth driver for controlling operation thereof.

2. The torch system according to claim 1, further comprising a monitoring system for monitoring plasma torch characteristics, the plasma torch characteristics comprising at least a size of the deposition spot formed on the surface of the object by the material of the protective coating and purity of the plasma torch.

3. The torch system of claim 2, wherein the focusing device is located between the plasma reactor and the object holder and comprises a gas manifold with a focusing gas; and an ion source in the form of a plurality of capillary tubes connected to the gas manifold, tilted in the direction of the tip of the plasma torch, uniformly surrounding the plasma torch, and directing the focusing gas through the electron cloud for generating positive ions and directing these positive ions tangentially toward the plasma torch in the direction of the torch tip in the amount sufficient for compensation of the spatial charge.

4. The torch system of claim 2, wherein the monitoring system comprises a gas mass flow controller through which the focusing gas is supplied to the focusing device; and a spectral optical system for controlling the optimal abundance of the spectrum of coating material in the plasma torch and for controlling the brightness of the torch spectrum and for spectral analysis of the content of the plasma torch.

5. The torch system of claim 4, further comprising a first feedback that connects the spectral optical system with the mass flow controller that supplies focusing gas to the focusing device in order to tune the flow of the focusing gas in the capillary tubes of the focusing device and to focus the plasma torch tip on the surface of the showerhead to a minimal size of the torch crossover according to the optimal abundance of spectrum of the focusing gas; a second feedback that connects the spectral optical system with the RF power supply; a third feedback that connects the RF power supply with the fourth controller; a fourth feedback that connects the spectral optical system with the first controller; a fifth feedback that connects the spectral optical system with the first controller; the sixth feedback that connects the spectral optical system with the multichannel controller; a seventh feedback that connects the multichannel controller with the mass flow controller; and the eight feedback that connects the spectral optical system with first controller.

6. The torch system according to claim 5, wherein the focusing gas is argon.

7. The torch system of claim 2, further comprising a first feedback that connects the spectral optical system with the mass flow controller that supplies focusing gas to the focusing device in order to tune the flow of the focusing gas in the capillary tubes of the focusing device and to focus the plasma torch tip on the surface of the showerhead to a minimal size of the torch crossover according to the optimal abundance of spectrum of the focusing gas; a second feedback that connects the spectral optical system with the RF power supply; a third feedback that connects the RF power supply with the fourth controller; a fourth feedback that connects the spectral optical system with the first controller; a fifth feedback that connects the spectral optical system with the first controller; the sixth feedback that connects the spectral optical system with the multichannel controller; a seventh feedback that connects the multichannel controller with the mass flow controller; and the eight feedback that connects the spectral optical system with first controller.

8. The torch system according to claim 7, wherein the focusing gas is argon.

9. The torch system of claim 1, wherein the focusing device is located between the plasma reactor and the object holder and comprises a gas manifold with a focusing gas; and an ion source in the form of a plurality of capillary tubes connected to the gas manifold, tilted in the direction of the tip of the plasma torch, uniformly surrounding the plasma torch, and directing the focusing gas through the electron cloud for generating positive ions and directing these positive ions tangentially toward the plasma torch in the direction of the torch tip in the amount sufficient for compensation of the spatial charge.

10. The torch system of claim 9, wherein the ends of the capillary tubes have oblique cutoffs in order to conform the conical shape of the plasma torch for ejecting the positive ions onto the torch tangentially to the surface of the torch, the end of each capillary tube being maintained in proximity to the surface of the torch but not contacting the surface of the plasma torch.

11. The torch system according to claim 10, wherein the gas manifold comprises a doughnut-shaped body that is located outside the plasma reactor and communicates with the ends of the capillary tubes opposite the oblique cutoffs.

12. The torch system according to claim 9, wherein for injecting the focusing gas onto the torch tangentially to the surface of the torch the capillary tubes are inclined to the axis of the torch at an angle ranging from 20 to 30°.

* * * * *